(12) United States Patent
Noda et al.

(10) Patent No.: US 9,048,624 B2
(45) Date of Patent: Jun. 2, 2015

(54) SEMICONDUCTOR LASER ELEMENT AND LASER BEAM DEFLECTING DEVICE

(71) Applicants: Kyoto University, Kyoto-shi, Kyoto (JP); HAMAMATSU PHOTONICS K.K., Hamamatsu-shi, Shizuoka (JP)

(72) Inventors: Susumu Noda, Kyoto (JP); Yoshitaka Kurosaka, Hamamatsu (JP); Akiyoshi Watanabe, Hamamatsu (JP); Kazuyoshi Hirose, Hamamatsu (JP); Takahiro Sugiyama, Hamamatsu (JP)

(73) Assignees: Kyoto University, Kyoto-shi, Kyoto (JP); HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/362,435

(22) PCT Filed: Dec. 5, 2012

(86) PCT No.: PCT/JP2012/081564
§ 371 (c)(1),
(2) Date: Jun. 3, 2014

(87) PCT Pub. No.: WO2013/084961
PCT Pub. Date: Jun. 13, 2013

(65) Prior Publication Data
US 2014/0348193 A1    Nov. 27, 2014

(30) Foreign Application Priority Data

Dec. 6, 2011   (JP) ................................. 2011-267186

(51) Int. Cl.
*H01S 3/00*        (2006.01)
*H01S 5/10*        (2006.01)
(Continued)

(52) U.S. Cl.
CPC ............... *H01S 5/105* (2013.01); *H01S 5/0425* (2013.01); *H01S 5/1085* (2013.01); *H01S 5/4056* (2013.01);
(Continued)

(58) Field of Classification Search
USPC ......... 372/38.02, 38.05, 43.01, 44.01, 44.011
See application file for complete search history.

(56) References Cited

U.S. PATENT DOCUMENTS 7,898,909 B2 *   3/2011   Shimazawa et al. ....... 369/13.33
2007/0280318 A1 * 12/2007  Yoshimoto et al. ........ 372/43.01
2014/0036947 A1 *  2/2014  Watanabe et al. .......... 372/44.01

FOREIGN PATENT DOCUMENTS

| JP | 2003-287633 A | 10/2003 |
| JP | 2006-047895 A | 2/2006 |
| JP | 2008-521255 A | 6/2008 |
| JP | 2009-076900 A | 4/2009 |

OTHER PUBLICATIONS

Yoshitaka Kurosaka, et al., "On-chip beam-steering photonic-crystal lasers," Nature Photonics, vol. 4, No. 7, Jul. 2010, pp. 447-450.
(Continued)

*Primary Examiner* — Dung Nguyen
(74) *Attorney, Agent, or Firm* — Drinker Biddle & Reath LLP

(57) ABSTRACT

According to a finite difference between inverse numbers of arrangement periods (a1 and a2) in first and second periodic structures, when seen in a thickness direction of a semiconductor laser element, at least two laser beams that form a predetermined angle ($\delta\theta$) with respect to a lengthwise direction of a first driving electrode (E2) are generated in the semiconductor laser element, one of the laser beams is set to be totally reflected in a light emission end surface, and a refractive angle ($\theta3$) of the other laser beam is set to be less than 90 degrees.

18 Claims, 23 Drawing Sheets

(51) Int. Cl.
*H01S 5/40* (2006.01)
*H01S 5/062* (2006.01)
*H01S 5/12* (2006.01)
*H01S 5/323* (2006.01)
*H01S 5/042* (2006.01)
*H01S 5/343* (2006.01)

(52) U.S. Cl.
CPC ........... *H01S 5/06243* (2013.01); *H01S 5/1218* (2013.01); *H01S 5/323* (2013.01); *H01S 5/34313* (2013.01)

(56) References Cited

OTHER PUBLICATIONS

Yoshitaka Kurosaka, et al., "Direction-Controllable, Single-Lobed Photonic Crystal Lasers for Beam Steering Functionality," CLEO Technical Digest, 2012.
English-language translation of International Preliminary Report on Patentability (IPRP) dated Jun. 19, 2014 that issued in WO Patent Application No. PCT/JP2012/081564.

* cited by examiner

Fig.4
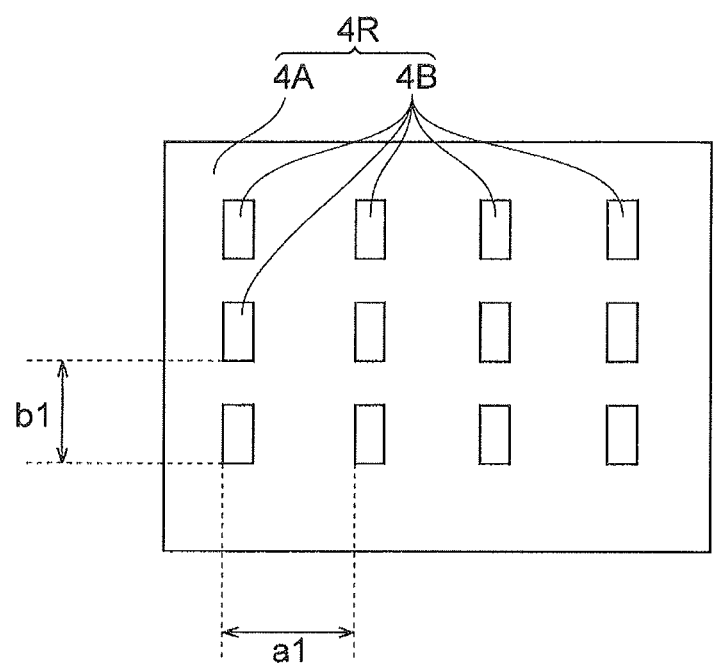
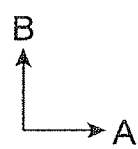

*Fig.5*
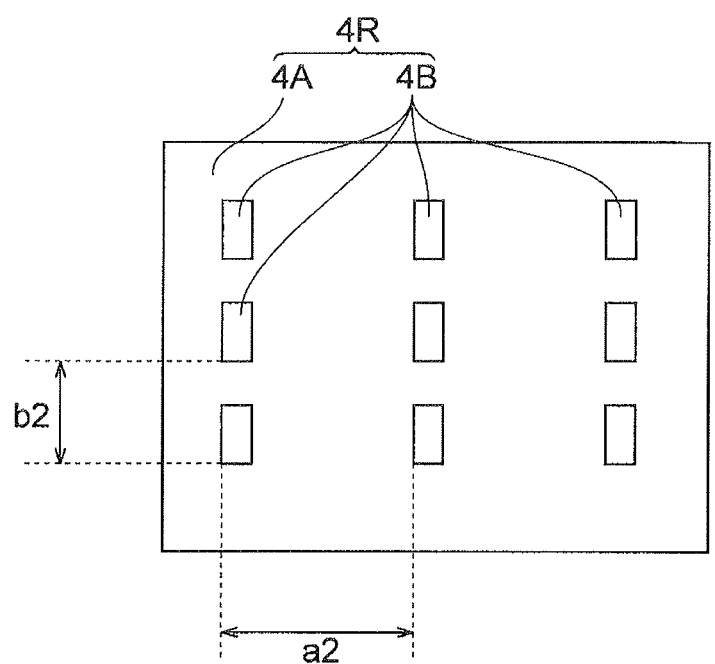
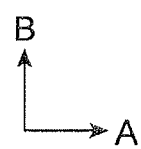

Fig.21

| θ3(°) | $a_y$(nm) | $a_{II}$(nm) | $a_I$(nm) | θ(°) | Λ(nm) |
|---|---|---|---|---|---|
| 0 | 310.02 | 281.74 | 344.61 | 84.27 | 486.08 |
| 10 | 304.96 | 281.67 | 332.45 | 85.27 | 478.92 |
| 20 | 301.03 | 282.39 | 322.29 | 86.23 | 473.32 |
| 30 | 298.15 | 283.80 | 314.02 | 87.11 | 469.21 |
| 40 | 296.20 | 285.70 | 307.50 | 87.89 | 466.43 |
| 50 | 295.01 | 287.85 | 302.53 | 88.58 | 464.72 |
| 60 | 294.38 | 289.97 | 298.92 | 89.13 | 463.82 |
| 70 | 294.11 | 291.76 | 296.48 | 89.54 | 463.43 |

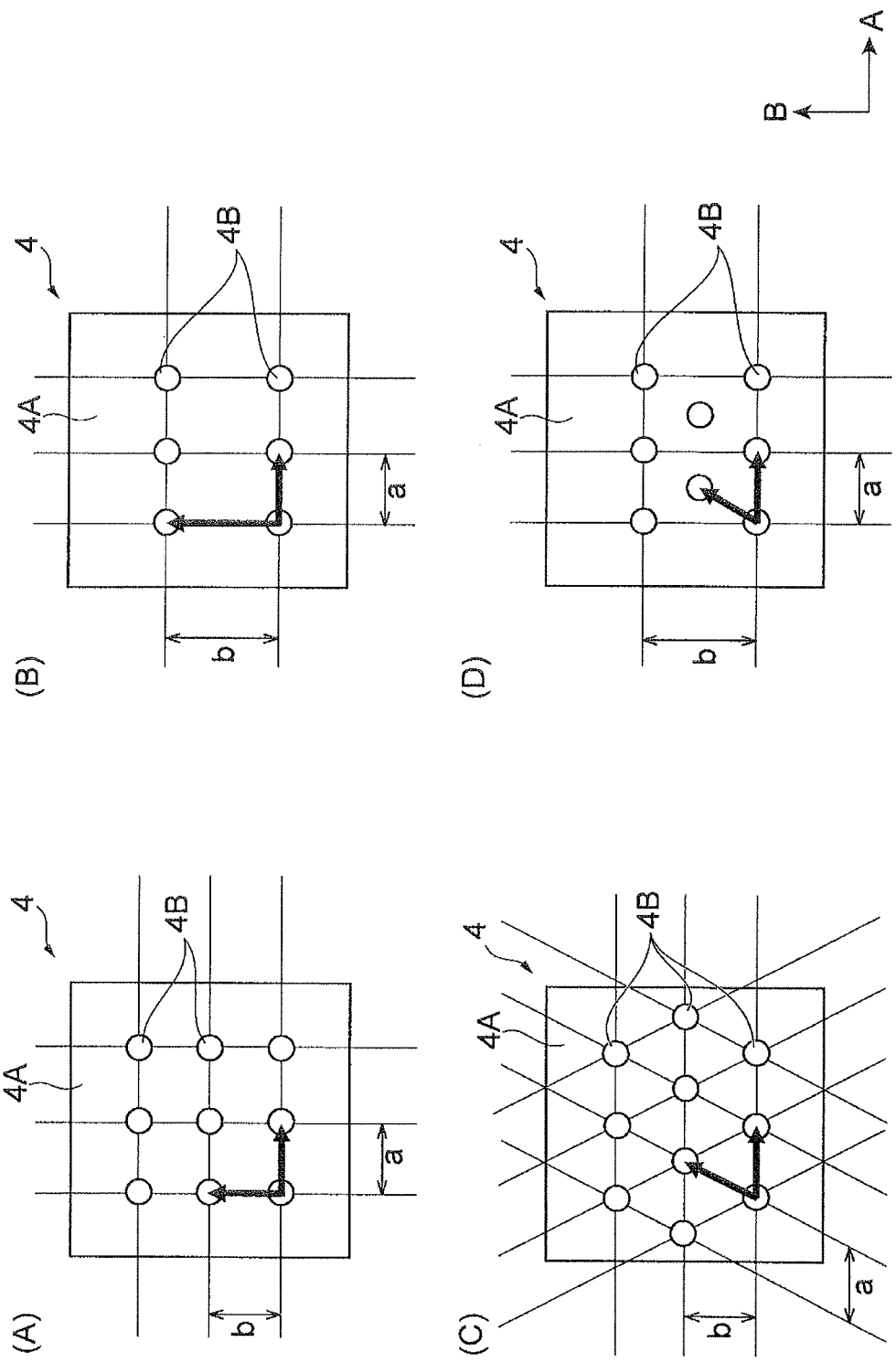

SEMICONDUCTOR LASER ELEMENT AND LASER BEAM DEFLECTING DEVICE

TECHNICAL FIELD

The present invention relates to an end emission type semiconductor laser element having a photonic crystal, and a laser beam deflecting device using the same.

BACKGROUND ART

The inventors have proposed a semiconductor laser element using a photonic crystal (Patent Literature 1, Non-Patent Literature 1). Such a surface emission type semiconductor laser element has a remarkable characteristic that laser beams can be simultaneously emitted in two directions at once. In addition, as a driving current is supplied to a plurality of driving electrodes, which are divided in plural, the laser beams can be emitted to each of the driving electrodes in two directions. When periods of the photonic crystal disposed immediately under each of the driving electrodes are different, each of the driving electrodes has different emission angles of laser beams. Further, according to Non-Patent Literature 1, as fragmented driving electrodes are installed, currents are simultaneously flowed to the plurality of driving electrodes and a current balance thereof is varied, continuous beam direction control becomes also possible.

CITATION LIST

Patent Literature

[Patent Literature 1] Japanese Patent Laid-Open Publication No. 2009-76900

Non-Patent Literature

[Non-Patent Literature 1] Kurozaka Yoshitaka et al., "On-Chip beam-steering photonic-crystal lasers", Nature Photonics, vol. 4, pp. 447-450, 2010

SUMMARY OF INVENTION

Technical Problem

However, in the case of a semiconductor laser element configured to simultaneously emit laser beams in two directions, a practical use is limited. Meanwhile, when the element is a semiconductor laser element configured to emit a laser beam in only one direction, i.e., a structure in which the laser beam in one direction can be emitted to each driving electrode, as a driving current supplied to each driving electrode is switched, and further, as the driving current balance is varied, scanning with the laser beam becomes possible. In this case, the semiconductor laser element can be applied to various laser beam deflecting devices or the like, which are used in the related art. When the number of laser beams is increased, the laser beam deflecting device can also configure a high definition laser beam scanning device.

In consideration of the above-mentioned problems, an aspect of the present invention is directed to provide a semiconductor laser element and a laser beam deflecting device capable of emitting a laser beam in only one direction and varying the emission direction.

Solution to Problem

In order to solve the problems, a semiconductor laser element according to an aspect of the present invention is an end emission type semiconductor laser element including: a lower cladding layer formed on a substrate; an upper cladding layer; an active layer interposed between the lower cladding layer and the upper cladding layer; a photonic crystal layer interposed between the active layer and at least one of the upper and lower cladding layers; and a first driving electrode configured to supply a driving current to a first region of the active layer, wherein a lengthwise direction of the first driving electrode is inclined with respect to a normal line of a light emission end surface of the semiconductor laser element when seen in a thickness direction of the semiconductor laser element, a region of the photonic crystal layer corresponding to the first region has first and second periodic structures in which arrangement periods of differential refractive index sections having different refractive indices from surroundings differ from each other, and according to a finite difference between inverse numbers of the arrangement periods of the first and second periodic structures, when seen in a thickness direction of the semiconductor laser element, at least two laser beams that form a predetermined angle with respect to the lengthwise direction of the first driving electrode are generated in the semiconductor laser element, one of the laser beams directed toward the light emission end surface is set to be less than a refractive angle of 90 degrees with respect to the light emission end surface, and at least one separate laser beam toward the light emission end surface is set to satisfy a total reflection critical angle condition with respect to the light emission end surface.

That is, in the end emission type laser element, in relation with emission by supply of the driving current to the first driving electrode, as an incident angle of the one laser beam in the laser element to the light emission end surface is the total reflection critical angle or more, the laser beam cannot be output to the outside. Since a refractive angle of the other laser beam is less than 90 degrees, the laser beam can be output to the outside via the light emission end surface.

In addition, the semiconductor laser element according to the aspect of the present invention further includes a second driving electrode configured to supply a driving current to a second region of the active layer, wherein a lengthwise direction of the second driving electrode is inclined with respect to a normal line of the light emission end surface of the semiconductor laser element when seen in the thickness direction of the semiconductor laser element, a region of the photonic crystal layer corresponding to the second region has third and fourth periodic structures in which arrangement periods of differential refractive index sections having different refractive indices from surroundings differ from each other, according to a finite difference between inverse numbers of the arrangement periods in the third and fourth periodic structures, when seen in the thickness direction of the semiconductor laser element, at least two laser beams that form a predetermined angle with respect to the lengthwise direction of the second driving electrode are generated in the semiconductor laser element, one of the laser beams directed toward the light emission end surface is set to be less than a refractive angle of 90 degrees with respect to the light emission end surface, at least one separate laser beam directed toward the light emission end surface is set to satisfy a total reflection critical angle condition with respect to the light emission end surface, and the finite difference between the inverse numbers of the arrangement periods in the first and second periodic structures is different from the finite difference between the inverse numbers of the arrangement periods in the third and fourth periodic structures.

That is, in the end emission type laser element, in relation with emission by supply of the driving current to the second driving electrode, as the incident angle of the one laser beam in the laser element to the light emission end surface is the total reflection critical angle or more, the laser beam cannot be output to the outside. Since the refractive angle of the other laser beam is less than 90 degrees, the laser beam can be output to the outside via the light emission end surface.

Here, in the regions in the photonic crystal layer corresponding to the driving electrodes, differences (emission direction determination factors) between the inverse numbers of the arrangement periods of the differential refractive index sections differ from each other. A value of the difference determines an emission direction of the laser beam. Accordingly, in both of the regions, since the values of the differences (the emission direction determination factors) differ from each other, the emission directions of the laser beams are different at the region corresponding to the first driving electrode and the region corresponding to the second driving electrode. Since one of the pair of laser beams generated in the regions enters the light emission end surface at the total reflection critical angle or more, the laser beam is not emitted to the outside. Accordingly, as supply of the driving current to the driving electrodes is switched, the laser beam in only one direction can be output in different directions.

In addition, when seen in the thickness direction of the semiconductor laser element, the differential refractive index sections in the photonic crystal layer are disposed in the lattice point positions of the lattice structure, and a direction of a basic translation vector of the lattice structure is different from a direction parallel to the light emission end surface. In this case, the one laser beam can satisfy the total reflection critical angle condition.

In addition, the lattice structure of the photonic crystal layer may be configured by assembling a square lattice, a rectangular lattice, a triangular lattice, and a face-centered rectangular lattice, for example, the square lattice and the rectangular lattice, the rectangular lattice and the rectangular lattice, the triangular lattice and the face-centered rectangular lattice, the face-centered rectangular lattice and the face-centered rectangular lattice, and so on, when seen in the thickness direction of the semiconductor laser element. The lattice structure of the photonic crystal layer is configured by selecting and combining at least two lattices from a lattice group constituted by a square lattice, a rectangular lattice, a triangular lattice, and a face-centered rectangular lattice, comprising the case of overlapping selection. That is, the lattice structure may be configured by combining the lattices having different pitches in relation with any one direction with respect to one lattice as described above.

In addition, provided that crystal structures of a square lattice and a rectangular lattice are included in the photonic crystal layer, the period in an axial direction of one side of the rectangular lattice is represented as a1, the period in the axial direction perpendicular to the one axis is represented as b1, the period in the axial direction of one side of the rectangular lattice is represented as a2, and the period in the axial direction perpendicular to the one axis is represented as b2, $a1=b1$, $a1 \neq a2$ and $b1=b2$ can be satisfied.

In this case, a standing wave state by diagonal light waves, which are not perpendicular to each other, is formed in a photonic crystal layer surface, and an angle formed by the diagonal light waves is varied according to the finite difference between a1 and a2.

In addition, provided that crystal structures of first and second rectangular lattices are included in the photonic crystal layer, the period in the axial direction of one side of the first rectangular lattice is represented as a1, the period in the axial direction perpendicular to the one axis is represented as b1, the period in the axial direction of one side of the second rectangular lattice is represented as a2, and the period in the axial direction perpendicular to the one axis is represented as b2, $a1 \neq a2$ and $b1=b2$ can be satisfied.

In this case, a standing wave state by diagonal light waves, which are not perpendicular to each other, is formed in a photonic crystal layer surface, and an angle formed by the diagonal light waves is varied according to the finite difference between a1 and a2.

In addition, provided that crystal structures of first and second face-centered rectangular lattices are included in the photonic crystal layer, the period in the axial direction of one side of the first face-centered rectangular lattice is represented as a1, the period in the axial direction perpendicular to the one axis is represented as b1, the period in the axial direction of one side of the second face-centered rectangular lattice is represented as a2, and the period in the axial direction perpendicular to the one axis is represented as b2, $a1 \neq a2$ and $b1=b2$ can be satisfied.

In this case, a standing wave state by diagonal light waves, which are not perpendicular to each other, is formed in a photonic crystal layer surface, and an angle formed by the diagonal light waves is varied according to the finite difference between a1 and a2.

Further, the first face-centered rectangular lattice may be a triangular lattice. The triangular lattice is a special case in which an angle formed by basic translation vectors that form a lattice of the face-centered rectangular lattice becomes 60 degrees.

In this case, a standing wave state by diagonal light waves, which are not perpendicular to each other, is formed in a photonic crystal layer surface, and an angle formed by the diagonal light waves is varied according to the finite difference between a1 and a2.

In addition, in the semiconductor laser element of the aspect, the differential refractive index section of the photonic crystal layer corresponding to the first region of the active layer and the differential refractive index section of the photonic crystal layer corresponding to the second region of the active layer have different shapes when seen in the thickness direction of the semiconductor laser element such that refractive angles of the laser beams output from the first and second regions differ from each other and strengths coincide with each other. In this case, since the strengths are equal, the element can be easily applied to electronic instruments or the like such as a laser printer, radar, or the like.

In the semiconductor laser element of the aspect, dimensions of the differential refractive index sections in directions in which arrangement periods of the differential refractive index sections in the first and second periodic structures differ from each other differ according to positions in the different directions, and dimensions of the differential refractive index sections in directions in which arrangement periods of the differential refractive index sections in the third and fourth periodic structures differ from each other differ according to positions in the different directions. Accordingly, an oscillation threshold can be reduced.

In addition, the semiconductor laser element of the aspect further includes a diffraction lattice structure (a diffraction lattice layer of FIGS. 19 and 22) configured to combine a laser beam reflected by the light emission end surface with a laser beam resonated in the active layer by satisfying a total reflection critical angle condition. In this case, energy utilization efficiency can be increased.

A laser beam deflecting device according to an aspect of the present invention includes the semiconductor laser element, and a driving current supply circuit configured to selectively supply a driving current to an electrode group comprising the first driving electrode and the second driving electrode. While the laser beam only in one direction can be output in different directions by switching the driving current, this pseudo-deflects the laser beam. The number of driving electrodes is not limited to two but may be three or more, and in this case, a structure configured to scan with laser beams at a small pitch can be provided.

In addition, the driving current supply circuit further has a means configured to vary a ratio of the driving currents supplied to the electrodes of the electrode group. That is, as a balance of the driving currents supplied to the electrode group including the first driving electrode and the second driving electrode is varied, the beam can be continuously deflected.

A period along a basic translation vector in the first periodic structure is continuously varied as the period approaches the third periodic structure. In this case, generation of reflection in an interface between photonic crystals having different periods can be prevented.

In addition, the following relations are satisfied in the first, second, third and fourth periodic structures such that resonance wavelengths of the laser beams generated from the first and second regions of the active layer immediately under the first and second driving electrodes becomes equal when a driving current is supplied to the first and second driving electrodes.

$$b1 = b2 = b_0/\sqrt{(1-\sin^2\delta\theta)}$$

$$\delta\theta = \phi - \sin^{-1}(\sin\theta3/n_{dev})$$

Further, $b_0$ represents a reference period with respect to a B direction (an alignment direction of the lattice point (an arrangement direction of the differential refractive index section)), $\phi$ represents an inclination of the entire photonic crystal, i.e., $\phi$ represents an inclination of the arrangement direction (the B direction) of the differential refractive index section with respect to a direction perpendicular to the light emission end surface, $\theta3$ represents an emission angle of the laser beam, and $n_{dev}$ represents an effective refractive index of light in the semiconductor laser element. When laser beam scanning is performed by a mirror or the like installed in a laser printer or the like, since the wavelengths of the laser beams before and after deflection are equal to each other, when the wavelength is constant, application to the related electronic instrument becomes easy.

A single light collecting element disposed in the vicinity of the light emission end surface is provided. In this case, when the laser beam passes through the light collecting element, the laser beam can be transmitted far away by suppressing a flare angle, or the laser beam can be collected to a near place by setting a focal position.

In addition, the light collecting element is a cylindrical lens, and a central axis of the cylindrical lens is perpendicular to a thickness direction of the active layer and parallel to the light emission end surface. The cylindrical lens is appropriate for concentration of point sources of light arranged in a bar shape, and concentration of light can be performed under the same condition regardless of positions.

In addition, the light collecting element is a convex lens, one axis passing through a center of curvature of the convex lens is perpendicular to a thickness direction of the active layer and parallel to the light emission end surface, and a radius of curvature around the axis is smaller than a radius of curvature around an axis perpendicular thereto. The same function can be exhibited when the convex lens is used instead of the cylindrical lens.

Advantageous Effects of Invention

In accordance with the semiconductor laser element and the laser beam deflecting device according to various aspects and the embodiment described above, the laser beam can be emitted in only one direction, and the emission direction can be varied.

BRIEF DESCRIPTION OF DRAWINGS

FIG. 4 is a plan view of a photonic crystal region having a single periodic structure;
FIG. 5 is a plan view of the photonic crystal region having the single periodic structure;
FIG. 21 is a table showing data used in the graph;
FIG. 23 is a plan view of a photonic crystal layer.

DESCRIPTION OF EMBODIMENTS

Figure 1:
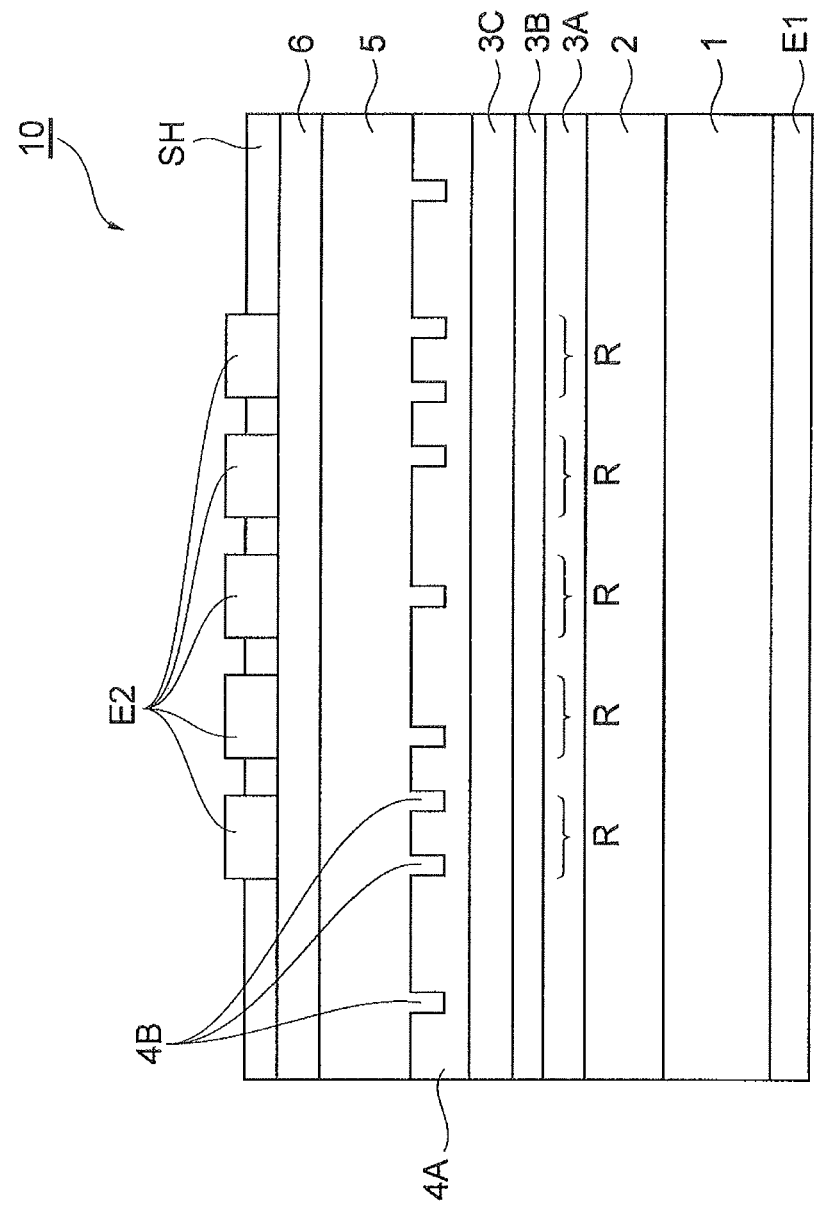
FIG. 1 is a longitudinal cross-sectional view of a semiconductor laser element.

Hereinafter, an end emission type semiconductor laser element and a laser beam deflecting device using the same according to an embodiment will be described. Further, the same components are designated by the same reference numerals, and detailed description thereof will be omitted.

Figure 2:
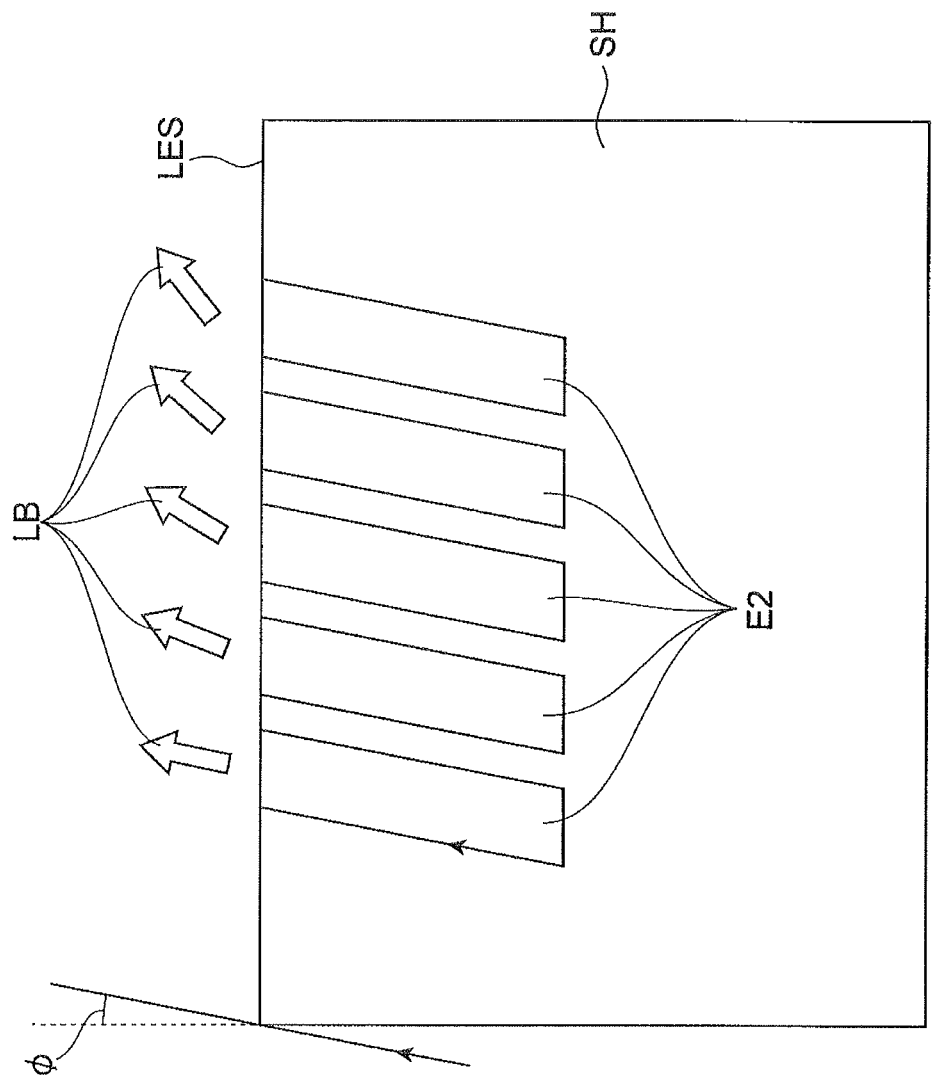
FIG. 2 is a plan view of the semiconductor laser element.

FIG. 1 is a longitudinal cross-sectional view of a semiconductor laser element, and FIG. 2 is a plan view of the semiconductor laser element.

A semiconductor laser element 10 includes a lower cladding layer 2, a lower light guide layer 3A, an active layer 3B, an upper light guide layer 3C, a photonic crystal layer 4, an upper cladding layer 5 and a contact layer 6, which are sequentially formed on a semiconductor substrate 1. An electrode E1 is formed on a rear surface side of the semiconductor substrate 1 throughout the entire surface, and a plurality of driving electrodes E2 are formed on the contact layer 6. In FIGS. 1 and 2, while five driving electrodes E2 are schematically shown, in reality, a larger number of driving electrodes E2 are formed on the contact layer 6.

Further, a surface on the contact layer 6 other than a formation region of the driving electrode E2 is covered by an insulating film SH. The insulating film SH may be formed of, for example, SiN or $SiO_2$.

Materials/thicknesses of these compound semiconductor layers are as follows. Further, a semiconductor whose conductivity type is not described is an intrinsic semiconductor having an impurity concentration of $10^{15}/cm^3$ or less. Further, the concentration when impurities are added is $10^{17}$ to $10^{20}/cm^3$. In addition, the following description is an example of the embodiment and when the example has a configuration including the active layer 3B and the photonic crystal layer 4, materials, a film thickness and a configuration of a layer have a degree of freedom.

The upper light guide layer 3C is constituted by two layers, that is, an upper layer and a lower layer.

Contact layer 6: P-type GaAs/50 to 500 nm
Upper cladding layer 5: P-type AlGaAs ($Al_{0.4}Ga_{0.6}As$)/1.0 to 3.0 μm
Photonic crystal layer 4:
  Basic layer 4A: GaAs/50 to 200 nm
  Buried layer (differential refractive index section) 4B: AlGaAs ($Al_{0.4}Ga_{0.6}As$)/50 to 200 nm
Upper light guide layer 3C:
  Upper layer: GaAs/10 to 200 nm
  Lower layer: p-type or intrinsic AlGaAs/10 to 100 nm
Active layer 3B (multiple quantum wall structure):
  AlGaAs/InGaAs MQW/10 to 100 nm
Lower light guide layer 3A: AlGaAs/0 to 300 nm
Lower cladding layer 2: N-type AlGaAs/1.0 to 3.0 μm
Semiconductor substrate 1: N-type GaAs/80 to 350 μm For example, AuGe/Au maybe used as a material of the electrode E1, and for example, Cr/Au or Ti/Au may be used as a material of the electrode E2.

Further, the light guide layer may be omitted.

In a manufacturing method of this case, a growth temperature of AlGaAs by MOCVD is 500° C. to 850° C., and in an experiment, 550 to 700° C. is employed, TMA (trimethyl aluminum) may be used as an Al source material upon growth, TMG (trimethyl gallium) and TEG (triethyl gallium) may be used as a gallium source material, $AsH_3$ (arsine) may be used as an As source material, $Si_2H_6$ (disilane) may be used as a source material for N-type impurities, and DEZn (diethyl zinc) may be used as a source material for P-type impurities.

When a current flows between the electrodes E1 and E2 disposed at upper and lower sides, a current flows through a region R immediately under any one of the electrodes E2, the region R emits light, and a laser beam LB is output from a side end surface of the substrate at a predetermined angle (see FIG. 2). As a driving current is supplied to any one of the driving electrodes E2, it is determined which laser beam LB is emitted.

When a planar shape of the semiconductor laser element is a rectangular shape and an XYZ three-dimensional orthogonal coordinate system is set, a thickness direction is a Z-axis, a width direction is an X-axis, and a direction perpendicular to a light emission end surface LES is a Y-axis. In an XY plane, a lengthwise direction in which the driving electrode E2 extends forms an angle φ with respect to a straight line parallel to the Y-axis. That is, the lengthwise direction of the driving electrode E2 is inclined with respect to a normal line (the Y-axis) of the light emission end surface LES of the semiconductor laser element when seen in a thickness direction of the semiconductor laser element. While the driving electrode E2 extends toward an end surface of an opposite side from a position of the light emission end surface LES, the driving electrode E2 does not entirely cross the semiconductor laser element but is interrupted along the way.

Figure 3:
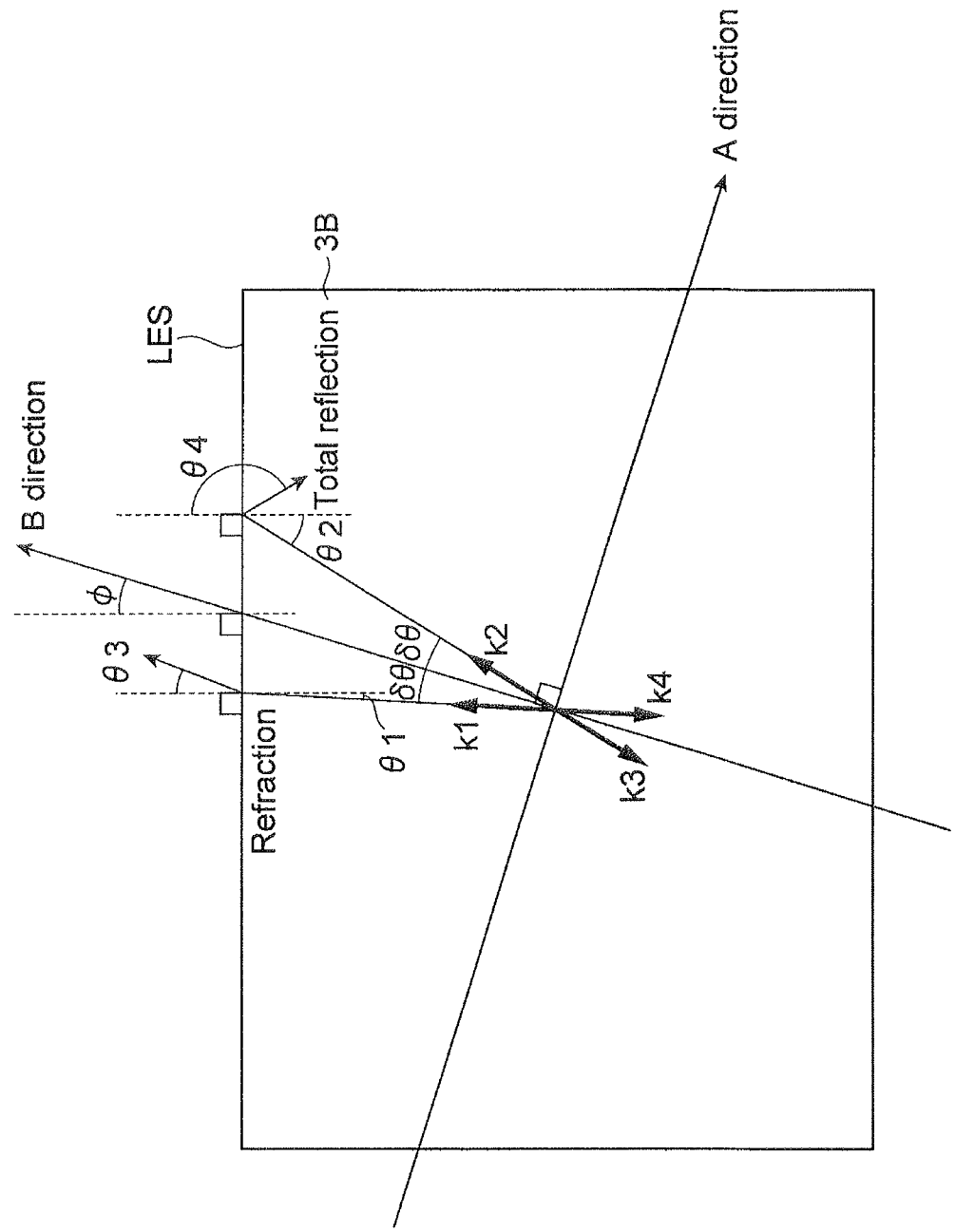
FIG. 3 is a plan view of the inside of the semiconductor laser element for describing a progress state of a laser beam in the element.

FIG. 3 is a plan view of the inside of the element for describing a progress state of the laser beam in the semiconductor laser element.

While the laser beam is generated in the active layer 3B, light emitted from the active layer 3B receives an influence of the photonic crystal layer 4 adjacent thereto. A periodic refractive index distribution structure is formed in the photonic crystal layer 4. As a result of receiving diffraction by the photonic crystal layer, laser beams represented by wave number vectors k1 to k4 are generated in the active layer 3B. The wave number vector is a vector in which a magnitude is a wave number, in a state in which a direction is a normal line direction of a wave surface (i.e., a propagation direction of a wave). The laser beams of the wave number vectors k1 and k2 are directed toward the light emission end surface LES and the laser beams of the wave number vectors k4 and k3 are directed in an opposite direction thereof.

The laser beams of the wave number vectors k1 and k2 progress to form angles of ±δθ with respect to a B direction that forms the angle φ with a straight line parallel to the Y-axis. Further, the B direction is a direction in which the driving electrode E2 extends. An A direction is a direction perpendicular to the B direction in the XY plane. Further, a coordinate system obtained by rotating the XYZ orthogonal coordinate system about the Z-axis by φ is an xyz orthogonal coordinate system. In this case, the A direction coincides with an x-axis positive direction, and the B direction coincides with a y-axis negative direction. The laser beams of the wave number vectors k1 and k2 enter the light emission end surface LES and are emitted to the outside, and incident angles thereof are represented as θ1 and θ2, respectively. A refractive angle of the laser beam of the wave number vector k1 is represented as θ3. θ3 is less than 90 degrees. That is, the incident angle θ2 of the laser beam of the wave number vector k2 is a total reflection critical angle or more, and total reflection occurs in the light emission end surface LES so that the laser beam is not output to the outside. Meanwhile, the incident angle θ1 of the laser beam of the wave number vector k1 is less than the total reflection critical angle, and the laser beam penetrates through the light emission end surface LES to be output to the outside. Further, θ4 is an angle formed by a progress direction of the laser beam totally reflected in the light emission end surface LES and the Y-axis negative direction, which is 90 degrees or more.

Further, the photonic crystal layer 4 is constituted by assembling a plurality of photonic crystal regions 4R.

FIG. 4 is a plan view of the photonic crystal region 4R having a single periodic structure.

The photonic crystal is a nano structure body in which a refractive index is periodically varied, and can strongly combine, i.e., diffract light of a specific wavelength in a specific direction according to the period. As the diffraction is used for confinement of the light and used as a resonator, the laser can be realized. The photonic crystal layer 4 of the embodiment is constituted by the basic layer 4A and the buried layer (the differential refractive index section) 4B periodically buried in the basic layer 4A.

In the embodiment, a plurality of holes H are periodically formed in the basic layer 4A formed of a first compound semiconductor (GaAs) having a blende structure, and the photonic crystal layer 4 formed by growing the buried layer 4B formed of a second compound semiconductor (AlGaAs) having a blende structure is provided in the hole H. Of course, in order to configure the photonic crystal, refractive indices of the first compound semiconductor and the second compound semiconductor are different. Further, in the embodiment, while the second compound semiconductor has a smaller refractive index than the first compound semiconductor, the first compound semiconductor may have a smaller refractive index than the second compound semiconductor.

The differential refractive index sections 4B serving as the buried layer are aligned in the A direction and the B direction to configure a two-dimensional periodic structure. Here, a pitch between the differential refractive index sections 4B in the A direction is represented as a1, and a pitch between the differential refractive index sections 4B in the B direction is represented as b1. Further, it may be the case that a1=b1. While a rectangular shape is shown as a planar shape of the differential refractive index section 4B in the AB plane in the same drawing, the planar shape of the differential refractive index section 4B is not limited thereto.

FIG. 5 is a plan view of the photonic crystal region 4R having a single periodic structure different from FIG. 4.

The differential refractive index sections 4B serving as the buried layer are aligned in the A direction and the B direction to configure the two-dimensional periodic structure. Here, a pitch between the differential refractive index sections 4B in the A direction is represented as a2, and a pitch between the differential refractive index sections 4B in the A direction is represented as b2. Further, a relation of a2>a1 is satisfied. While a rectangular shape is also shown as a planar shape of the differential refractive index section 4B in the AB plane of the same drawing, the planar shape of the differential refractive index section 4B is not limited thereto.

Figure 6:
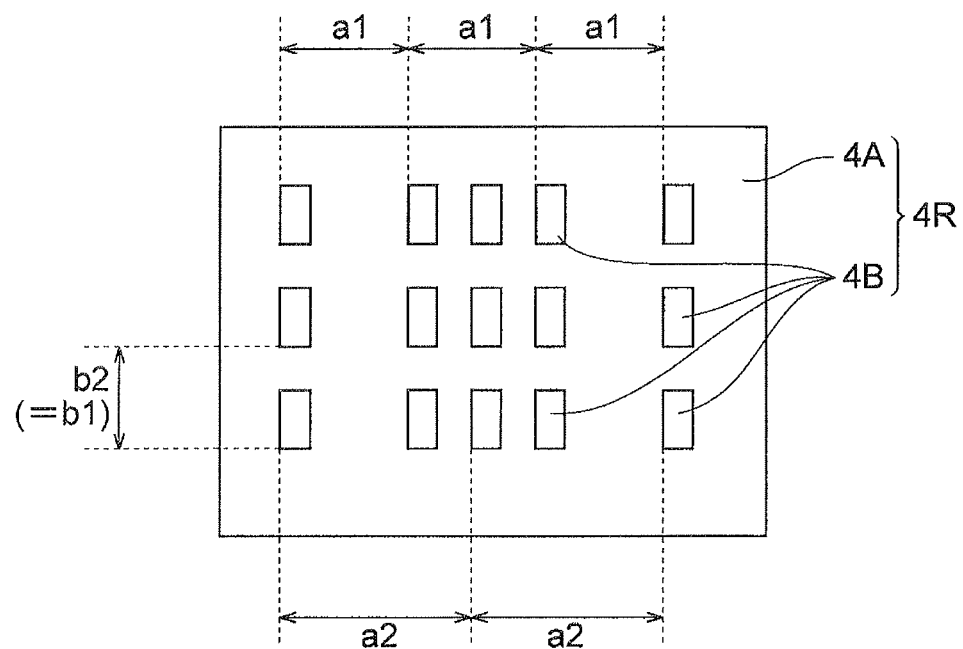
FIG. 6 is a plan view of a photonic crystal region having a plurality of periodic structures.

FIG. 6 is a plan view of the photonic crystal region 4R having a plurality of periodic structures.

That is, in the photonic crystal region 4R, the single photonic crystal region 4R includes the periodic structure shown in FIG. 4 and the periodic structure shown in FIG. 5, and has the period a1 and the period a2. In addition, in the same drawing, the period of the B direction is shown as commonly becoming b2 (=b1).

In the case of such a structure, according to a finite difference between an inverse number (1/a1) of the period a1 and an inverse number (1/a2) of the period a2, δθ in FIG. 3 is determined. That is, as the periods a1 and a2 are determined, progress directions of the laser beam represented by the wave number vectors k1 and k2 can be determined. Further, $\delta\theta = \sin^{-1}(\delta k/k)$, and $\delta k = |\pi\{(1/a1)-(1/a2)\}|$, are satisfied, wherein $k = 2\pi/\lambda$. $\lambda$ is a wavelength of the laser beam in the semiconductor laser element, and k is a wave number of the laser light in the semiconductor laser element.

In the case of the embodiment, an inequality expression that satisfies the parameters θ1 and θ2 and an effective refractive index $n_{dev}$ of the light in the semiconductor laser element is as follows.

$$0 \leq \theta 1 < \sin^{-1}(1/n_{dev})$$

$$\theta 2 \geq \sin^{-1}(1/n_{dev})$$

In addition, considering that the entire photonic crystal is inclined by φ throughout the present invention, equations that satisfy parameters are as follows.

$$\delta\theta = \phi - \sin^{-1}(\sin\theta 3/n_{dev})$$

$$\delta k = (2\pi/\lambda_0)\sin\{\phi - \sin^{-1}(\sin\theta 3/n_{dev})\}$$

$$b1 = b2 = b_0/\sqrt{(1-\sin^2\delta\theta)}$$

$$a1 = 1/\{(\delta k/2\pi)+(1/b1)\}$$

$$a2 = 1/\{(1/b2)-(\delta k/2\pi)\}$$

Further, $b_0$ is a reference period with respect to the B direction (an alignment direction of a lattice point (an arrangement direction of a differential refractive index section)), for example, about 290 nm.

That is, when φ is an inclination of an arrangement direction (the B direction) of the differential refractive index section with respect to a direction perpendicular to the light emission end surface LES, θ3 is an emission angle of the laser beam, $n_{dev}$ is an effective refractive index of the light in the semiconductor laser element, and the driving current is supplied to the first and second driving electrodes, the periods b1 and b2 are in reverse proportion of $\sqrt{\{1-\sin^2(\phi-\sin^{-1}(\sin\theta 3/n_{dev}))\}}$ in relation with one of a direction along the basic translation vector in first, second, third and fourth periodic structures (to be described below) such that resonance wavelengths of the laser beams generated at the first and second regions of the active layer immediately under the first and second driving electrodes are equal to each other. As setting of the periods is varied, the emission angle θ3 can be varied.

A total reflection critical angle θc when a total reflection condition of the laser beam of the wave number vector k2 is satisfied is given as $\theta c = \sin^{-1}(1/n_{dev})$, and in the case of the example, φ=18.5°, and θ2>θc=17.6°.

Figure 7:
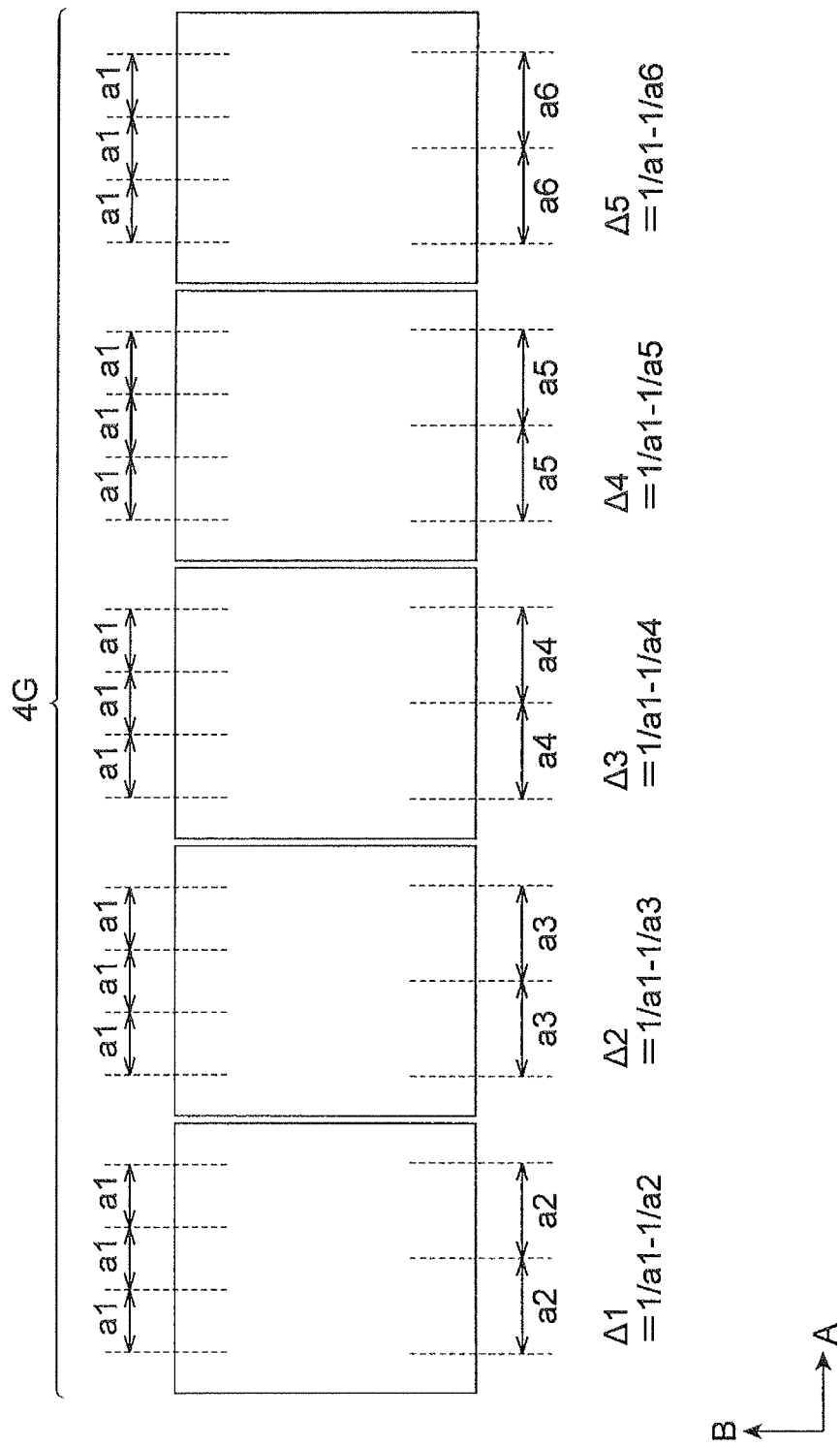
FIG. 7 is a plan view of a photonic crystal region group having a plurality of photonic crystal layer regions having a plurality of periodic structures.

FIG. 7 is a plan view of a photonic crystal region group 4G having the plurality of photonic crystal layer regions 4R, each having a plurality of periodic structures. The photonic crystal layer regions 4R are aligned and disposed in the A direction.

A first photonic crystal layer region 4R from a left side is a region Δ1, a second photonic crystal layer region 4R is a region Δ2, a third photonic crystal layer region 4R is a region Δ3, a fourth photonic crystal layer region 4R is a region Δ4, and a fifth photonic crystal layer region 4R is a region Δ5. For the sake of convenience, Δ1 to Δ5 represents parameters of the inverse numbers of the periods.

In the region Δ1, the differential refractive index sections 4B that satisfy the period a1 and the period a2 shown in FIG. 6 are arranged in the A direction, and the differential refractive index sections 4B are arranged in the B direction at the period b2.

Similarly, in the region Δ2, the differential refractive index sections 4B that satisfy the period a1 and a period a3 are arranged in the A direction, and the differential refractive index sections 4B are arranged in the B direction at the period b2.

In the region Δ3, the differential refractive index sections 4B that satisfy the period a1 and a period a4 are arranged in the A direction, and the differential refractive index sections 4B are arranged in the B direction at the period b2.

In the region Δ4, the differential refractive index sections 4B that satisfy the period a1 and a period a5 are arranged in the A direction, and the differential refractive index sections are arranged in the B direction at the period b2.

In the region Δ5, the differential refractive index sections 4B that satisfy the period a1 and a period a6 are arranged in the A direction, and the differential refractive index sections 4B are arranged in the B direction at the period b2. However, a relation of a1<a2<a3<a4<a5<a6 is satisfied.

When using a general equation, regions ΔN (N is a natural number) are arranged in the A direction such that a value of N is arranged from a left side to a right side in a sequence from a small value, and in the regions ΔN, the differential refractive index sections 4B that satisfy the period a1 and the period a(N+1) are arranged in the A direction, and the differential refractive index sections 4B are arranged in the B direction at the period b2 to satisfy aN<a(N+1).

Accordingly, according to a difference between the inverse numbers of the periods, the laser beams can be emitted in different directions.

Figure 8:
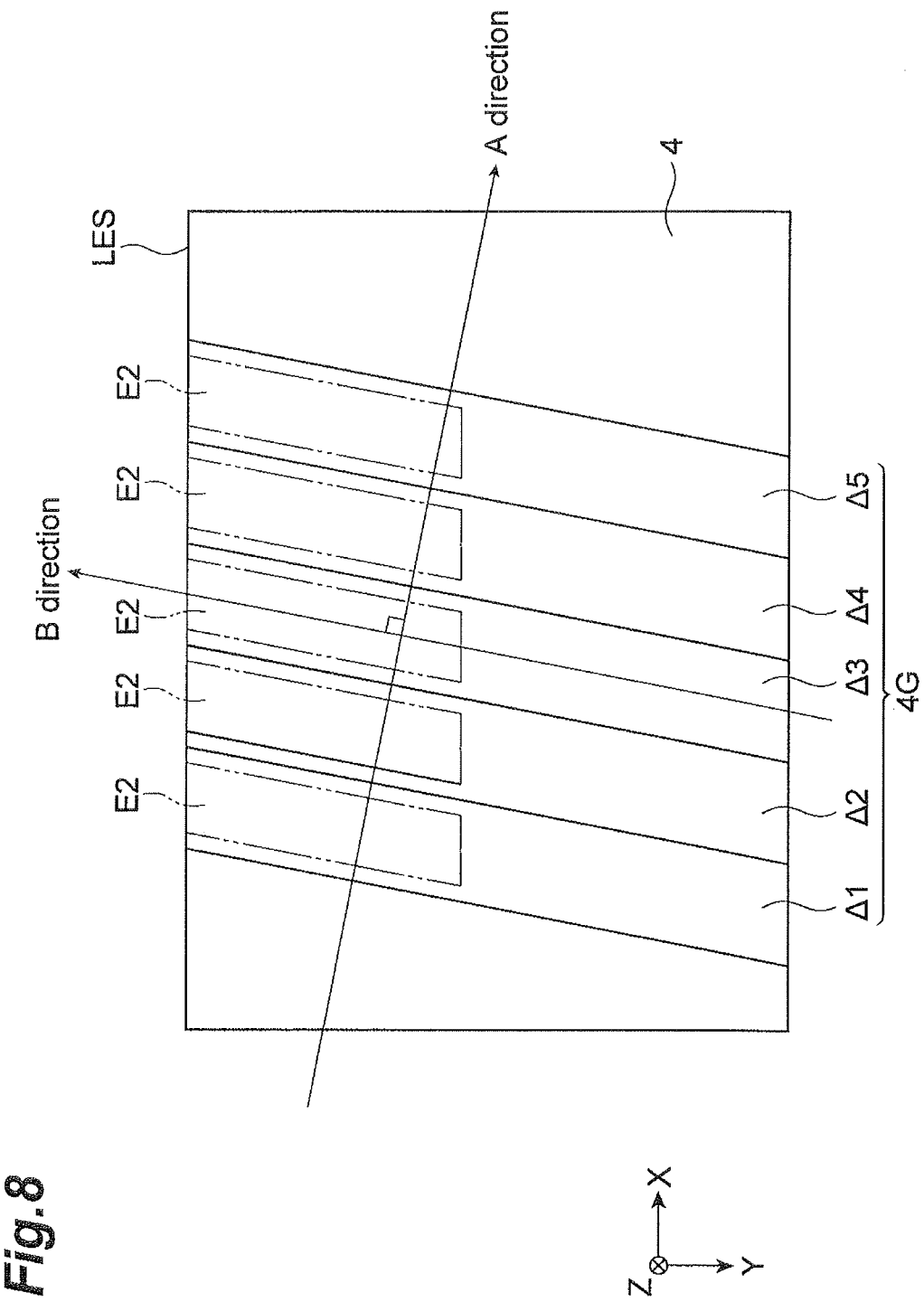
FIG. 8 is a plan view of a photonic crystal layer having a photonic crystal region groups.

FIG. 8 is a plan view of the photonic crystal layer having the photonic crystal region group 4G.

In the photonic crystal layer 4, the regions Δ1 to Δ5 are sequentially disposed in the A direction. A lengthwise direction of each of the regions Δ1 to Δ5 coincides with the B direction (the lengthwise direction of the driving electrode E2). When the driving current is selectively supplied to each of the driving electrodes E2 (a driving voltage is applied between the electrode E1 and the specific electrode E2), the laser beams are each emitted from the light emission end surface LES in different directions (see FIG. 2).

Figure 9:
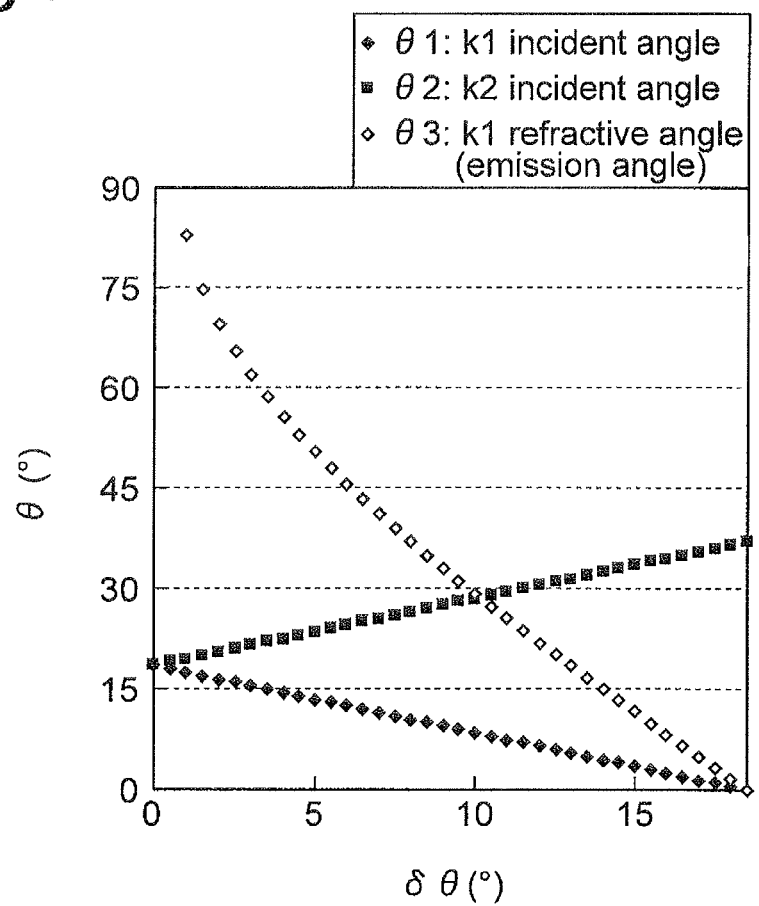
FIG. 9 is a graph showing an incident angle and an emission angle of a laser beam with respect to a deflection angle $\delta\theta$ (depending on a difference of an inverse number of a period in each of the photonic crystal regions) from a reference direction.

FIG. 9 is a graph showing an incident angle and an emission angle of a laser beam with respect to a deflection angle δθ (depending on a difference between inverse numbers of the periods in the photonic crystal regions) from a reference direction (the B direction).

When the angle δθ is increased as the difference between the inverse numbers of the periods is increased, the incident angles θ1 and θ2 are increased, and a refractive angle (an emission angle) of the laser beam represented as a k1 vector is reduced from 90° to 0°. φ=18.5°, and δθ is varied from 0° to 18.5°. The effective refractive index $n_{dev}$ of the light in the semiconductor laser element is 3.3. As the angle δθ is adjusted, an emission angle of the laser beam, which becomes an object thereof, can be adjusted within a wide range. Meanwhile, since θ2 always exceeds a total reflection critical angle at the laser beam represented by a k2 vector regardless of a value of δθ, the total reflection is always generated but not output to the outside.

Figure 10:
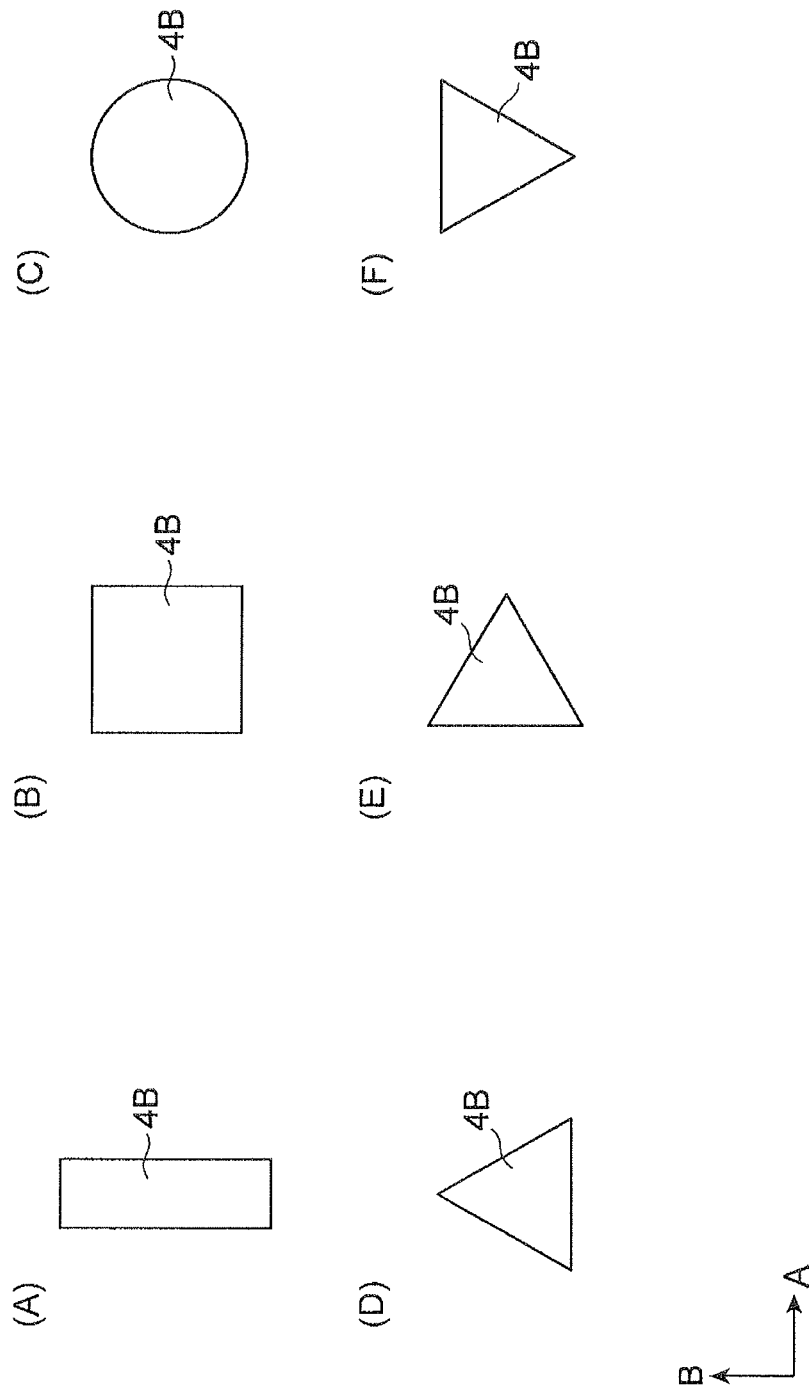
FIG. 10 is a plan view of a differential refractive index section (a structure body) of various shapes.

FIG. 10 is a plan view of the differential refractive index section (the structure body) 4B having various shapes.

In the above-mentioned description, while the rectangular shape (A) is shown as a shape in the AB plane (the XY plane) of the differential refractive index section 4B, and the shape may be a square (B), an ellipse or a circle (C), or may also be an isosceles or regular triangle (D). In addition, as a direction of the triangle, in addition to a triangle (D) having a bottom line parallel to the A direction, a triangle (E) having a bottom line parallel to the B direction, and a triangle (F) obtained by rotating the triangle shown as (D) 180° may be used. Further, the rotation or the dimension ratio of any of the shapes can be varied. Further, a distance between centers of the shapes can be used as an arrangement period of these shapes.

Further, since the two periodic structures are overlapped and thus a difference in the number of openings occurs due to a difference between the periods, a difference in diffraction strength is generated by the two periodic structures. In order to reduce the difference, it is effective for a shape length in the A direction in relation with the structure of the period a1 to be multiplied by a1/b1, and a shape length in the A direction with respect to the structure of the period a2 to be multiplied by a2/b2 (=b1).

Further, in the above-mentioned embodiment, when the number of the driving electrodes E2 is one, the semiconductor laser element that can output the beam in only one direction is configured. When the number of the driving electrodes E2 is plural, the laser beam deflecting device can be configured.

Figure 11:
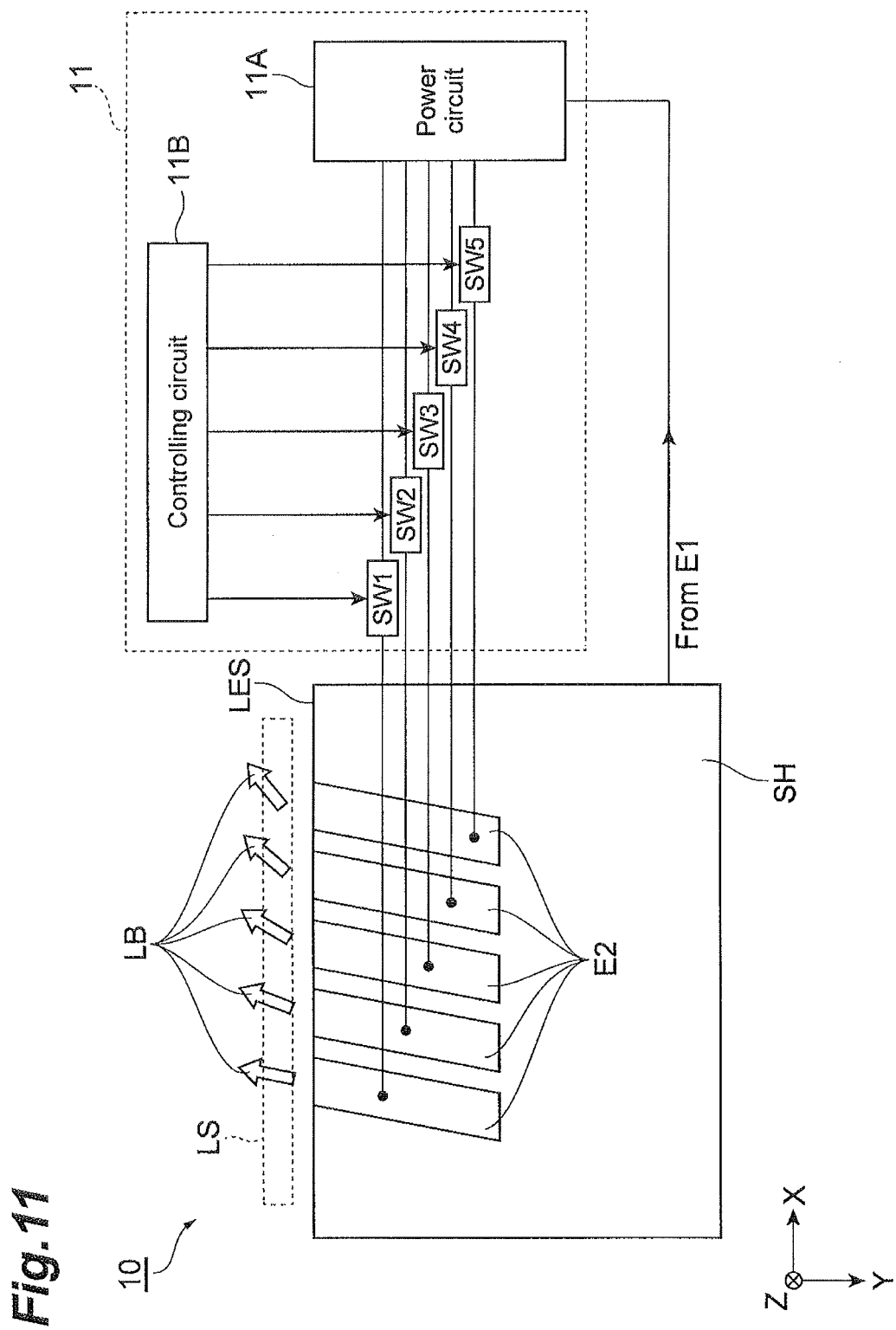
FIG. 11 is a view showing a configuration of the laser beam deflecting device.

FIG. 11 is a view showing a configuration of the laser beam deflecting device using the semiconductor laser element.

In addition, the laser beam deflecting device includes the above-mentioned semiconductor laser element 10, and a driving current supply circuit 11 configured to selectively supply a driving current to an electrode group including a first driving electrode E2 (the leftmost driving electrode), a second driving electrode (a second driving electrode from the left side), a third driving electrode (a third driving electrode from the left side), a fourth driving electrode (a fourth driving electrode from the left side) and a fifth driving electrode (a fifth driving electrode from the left side).

The driving current supply circuit 11 includes a power circuit 11A configured to supply a driving current to the driving electrodes E2 via switches SW1, SW2, SW3, SW4 and SW5, and a controlling circuit 11B configured to control ON/OFF of the switches SW1, SW2, SW3, SW4 and SW5. While only the laser beam LB in one direction can be output in different directions as the driving current supplied from the power circuit 11A is switched by the controlling circuit 11B, the laser beam LB is pseudo-deflected. While the deflection operation is possible even when the number of driving electrodes is two, when the number is three or more, a structure for scanning with laser beams at a small pitch is also possible.

Figure 12:
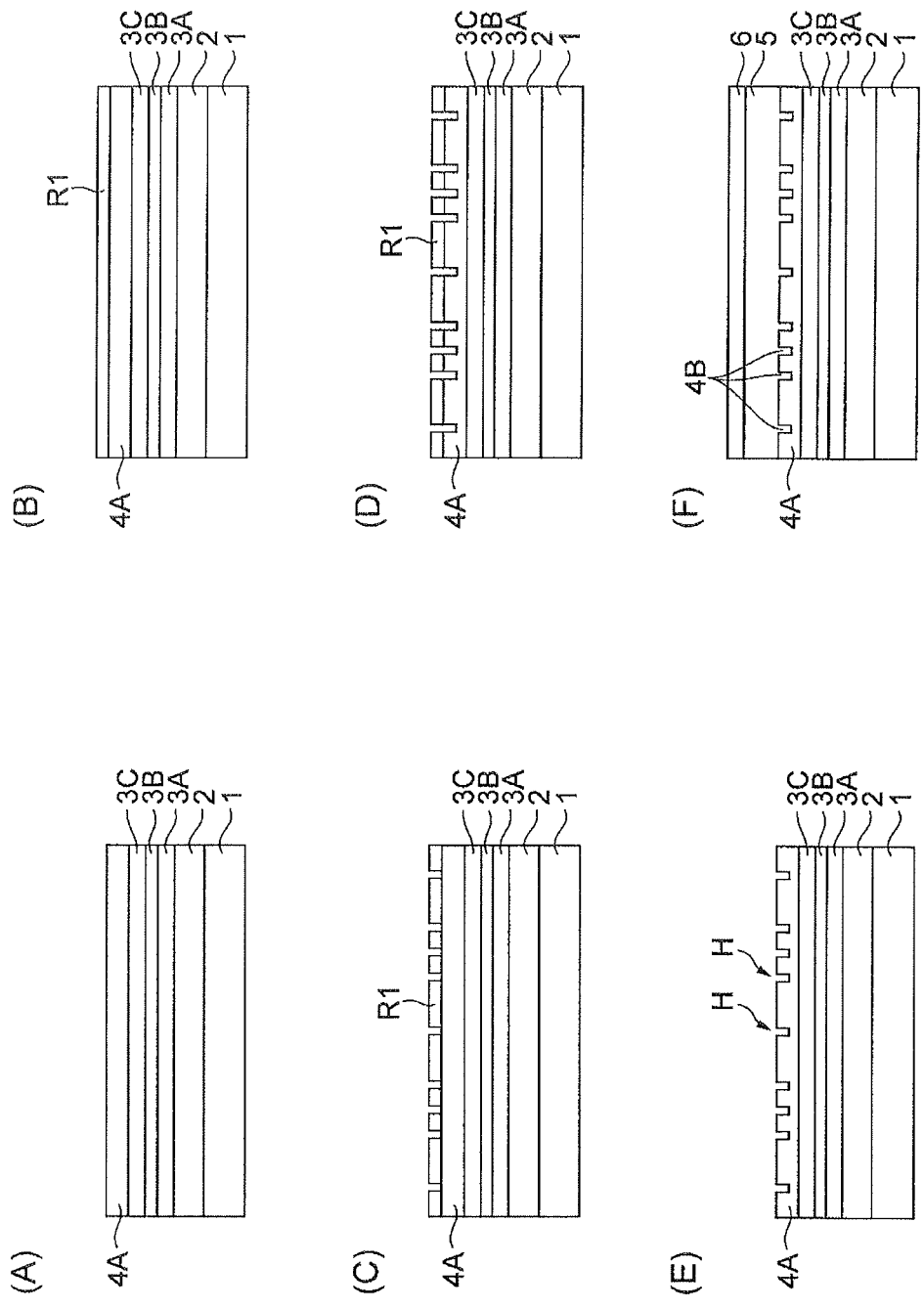
FIG. 12 is a view for describing a method of manufacturing a semiconductor laser element.
Figure 13:
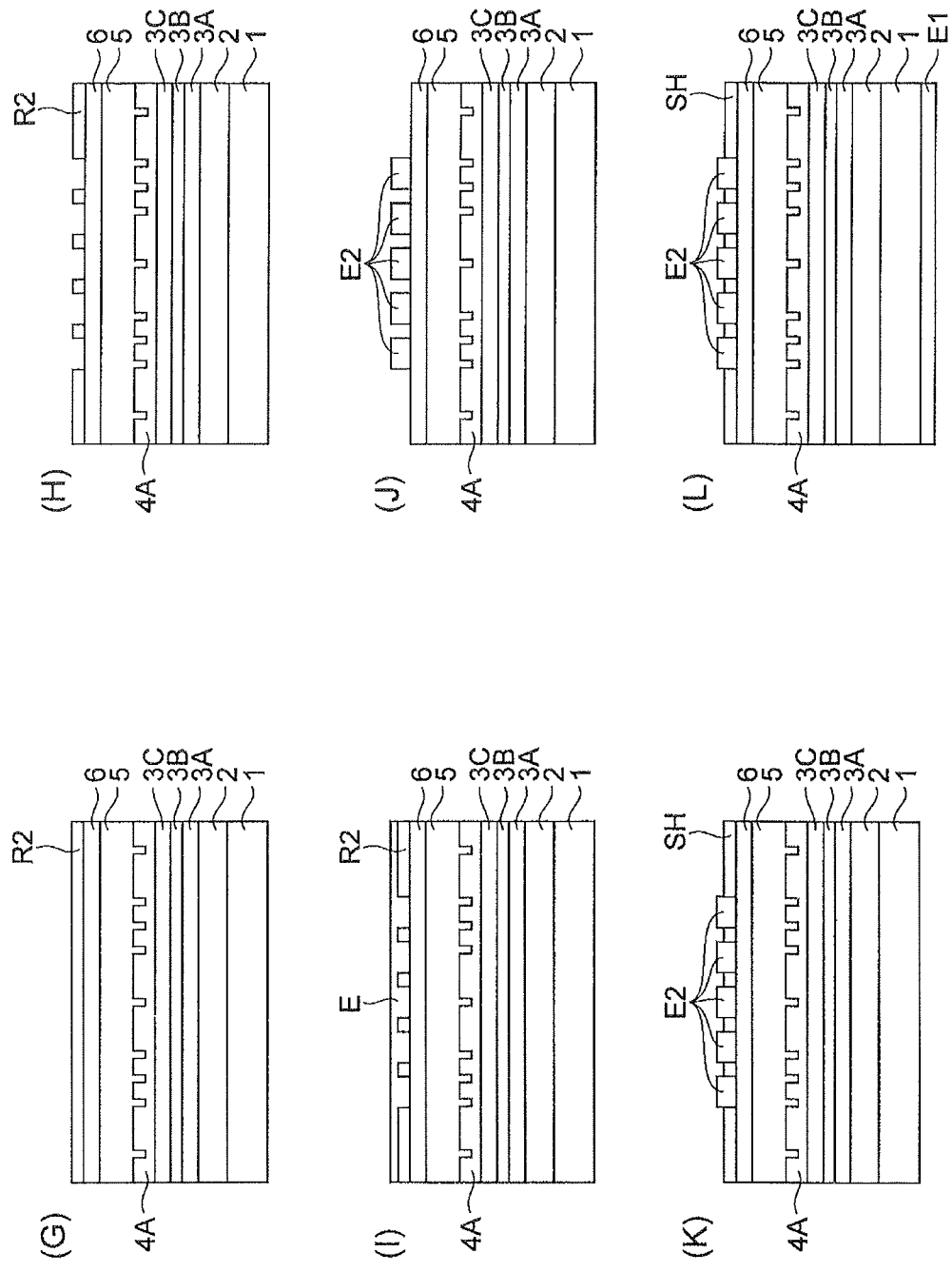
FIG. 13 is a view for describing the method of manufacturing the semiconductor laser element.

FIGS. 12 and 13 is a view for describing a method of manufacturing a semiconductor laser element.

An N-type cladding layer (AlGaAs) 2, a guide layer (AlGaAs) 3A, a multiple quantum wall structure (InGaAs/AlGaAs) 3B, a light guide layer (GaAs/AlGaAs) or a spacer layer (AlGaAs) 3C, and a basic layer (GaAs) 4A formed of a photonic crystal layer are sequentially epitaxially grown on an N-type (referred to as a first conductivity type) semiconductor substrate (GaAs) 1 using a metal organic chemical vapor deposition (MOCVD) method (FIG. 12(A)).

Next, a resist R1 is applied on the basic layer 4A (FIG. 12(B)), a 2-dimensional fine pattern is drawn and developed by an electron beam lithography system, and thus the 2-dimensional fine pattern (corresponding to a position of the differential refractive index section) is formed on the resist (FIG. 12(C)).

After that, the 2-dimensional fine pattern having a depth of about 100 nm is transferred on the basic layer 4A through dry etching (FIG. 12(D)), and the resist is removed (FIG. 12(E)). After that, regrowth is performed using the MOCVD method, the differential refractive index section 4B is formed in the basic layer 4A, and the cladding layer 5 is formed thereon.

In the regrowth process, the buried layer (AlGaAs) 4B grows in the hole H, after which the P-type cladding layer (AlGaAs) 5 and a P-type contact layer (GaAs) 6 sequentially and epitaxially grow (FIG. 12(F)).

Next, a resist R2 is formed on the P-type contact 6 (FIG. 13(G)), a strip-shaped pattern is patterned by optically exposing the resist R2 (FIG. 13(H)), the electrode E is deposited from above the resist R2 (FIG. 13(I)), and an electrode material is removed by lift-off, leaving only the electrode E2 (FIG.

13(J)). Then, the insulating film SH is formed on a surface of the contact layer 6 except for a formation position of the electrode E2 (FIG. 13(K)), and finally, a rear surface of the N-type semiconductor substrate 1 to form the N-type electrode E1 (FIG. 13(L)), thereby completing the semiconductor laser element.

Further, in the embodiment, while the electron beam exposure method has been described as a method of forming the hole H, other fine processing technologies such as optical exposures of nano imprint, interference exposure, FIB, stepper, and the like, may be used.

Further, in the above-mentioned description, while the example using one photonic crystal layer 4 has been described, the example may be configured using two photonic crystal layers 4.

Figure 14:
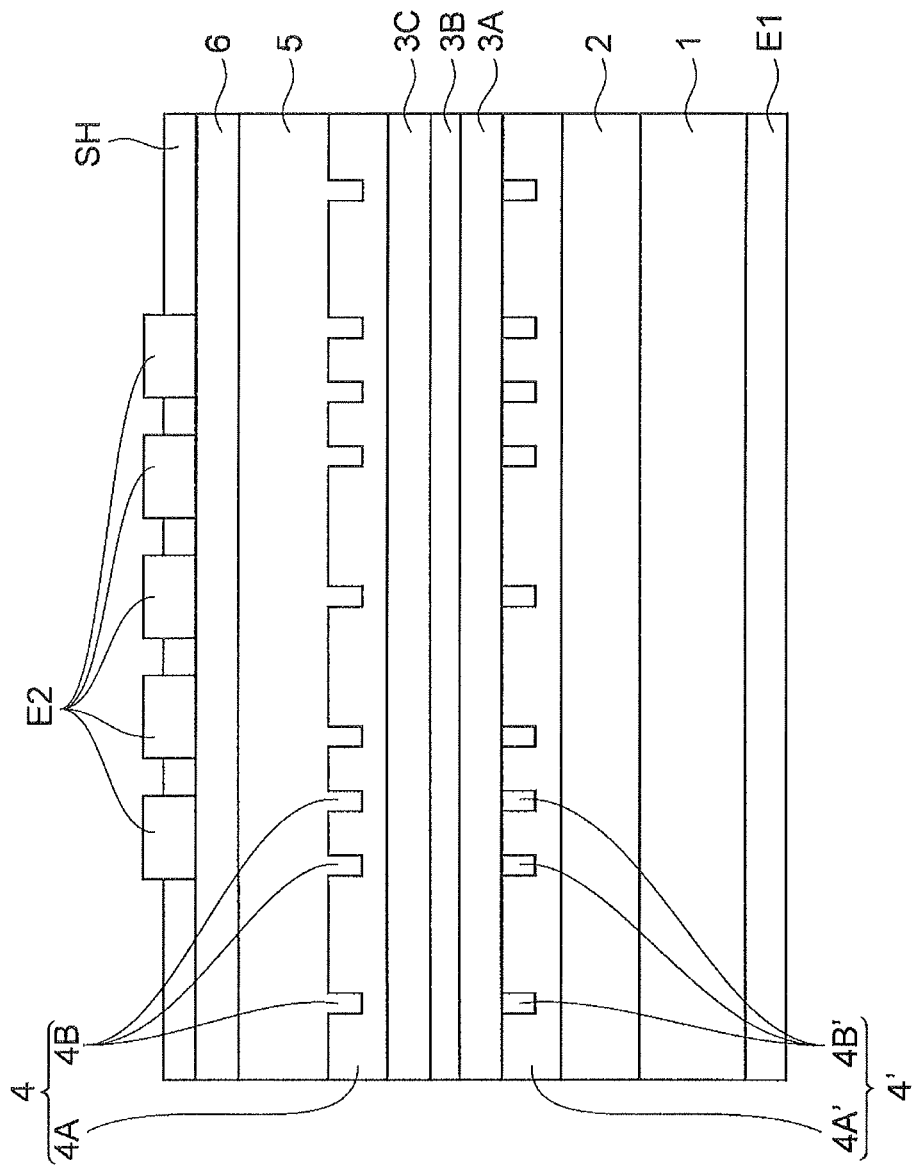
FIG. 14 is a longitudinal cross-sectional view of the semiconductor laser element.

FIG. 14 is a longitudinal cross-sectional view of the semiconductor laser element.

The element shown in FIG. 14 is distinguished from the element shown in FIG. 1 only in that a second photonic crystal layer 4' is installed between the cladding layer 2 and the light guide layer 3A (the active layer 3B). Further, the second photonic crystal layer 4' includes a basic layer 4A' formed of the same material as the first photonic crystal layer 4, and a differential refractive index section 4B'.

When the photonic crystal layer 4 shown in FIG. 1 is the first photonic crystal layer, the photonic crystal layer 4 has a refractive index distribution structure having a single periodic structure shown in FIG. 4, and the second photonic crystal layer 4' has a refractive index distribution structure in which the periods a3 to a4 in the regions are arranged in the A direction, in addition to the single periodic structure of the period a2 shown in FIG. 5. That is, when overlapping of the photonic crystal layers 4 and 4' is seen in the thickness direction of the semiconductor laser element, similar to that shown in FIG. 7, the regions Δ1 to Δ5 are aligned in the A direction. Even in the case of such a structure, as the parameters are set as described above, the same working effect as the structure shown in FIG. 1 can be obtained.

Further, in the case of manufacturing such a structure, after formation of the cladding layer 2, the same manufacturing method as of the first photonic crystal layer 4 is performed (however, growth is stopped when the differential refractive index section 4B is formed), and then the layers after the light guide layer 3A may be manufactured thereon through the same method as the above-mentioned manufacturing method.

In addition, even in a structure using the second photonic crystal layer 4' having the same structure as the first photonic crystal layer 4 including two refractive index periodic structures instead of the first photonic crystal layer 4, the same effect is exhibited.

As described above, the above-mentioned semiconductor laser element is an end emission type semiconductor laser element, and includes the lower cladding layer 2 formed on the substrate 1, the upper cladding layer 5, the active layer 3B (which may include the light guide layer) interposed between the lower cladding layer 2 and the upper cladding layer 5, the photonic crystal layer 4 or 4' interposed between the active layer 3B and at least one of the upper and lower cladding layers, and the first driving electrode E2 configured to supply a driving current to a first region R (a region immediately under the one driving electrode E2) of the active layer 3B, wherein a lengthwise direction of the first driving electrode E2 is inclined with respect to a normal line (the Y-axis) of the light emission end surface LES of the semiconductor laser element when seen in the thickness direction of the semiconductor laser element, the region Δ1 corresponding to the first region R of the photonic crystal layer 4 or 4' has first and second periodic structures having different arrangement periods of the differential refractive index sections having refractive indices different from surroundings, two laser beams forming a predetermined angle δθ with respect to the lengthwise direction (the B direction) of the first driving electrode E2 are generated in the semiconductor laser element according to a finite difference between inverse numbers of the arrangement periods (a1, a2) in the first and second periodic structures when seen in the thickness direction of the semiconductor laser element, only one of the laser beams is set to satisfy a total reflection condition, and a refractive angle θ3 of the other laser beam is set to be less than 90 degrees.

That is, in the end emission type laser element, in relation with the emission due to supply of the driving current to the first driving electrode E2, as an incident angle θ of the one laser beam to the light emission end surface in the laser element is a total reflection critical angle or more, the laser beam cannot be output to the outside. Since the refractive angle θ3 of the other laser beam is less than 90 degrees, the laser beam can be output to the outside via the light emission end surface.

In addition, the semiconductor laser element according to an aspect of the present invention further includes the second driving electrode E2 configured to supply a driving current to a second region R (a region immediately under the second driving electrode E2) of the active layer 3B, a lengthwise direction (the B direction) of the second driving electrode E2 is inclined with respect to a normal line (the Y-axis) of the light emission end surface LES of the semiconductor laser element when seen in the thickness direction of the semiconductor laser element, the region Δ2 corresponding to the second region of the photonic crystal layer has third and fourth periodic structures in which arrangement periods of the differential refractive index sections having refractive indices different from surroundings alternate, two laser beams that form a predetermined angle δθ with respect to the lengthwise direction of the second driving electrode E2 are generated in the semiconductor laser element according to a finite difference between the inverse numbers of the arrangement periods (a1, a3) of the third and fourth periodic structures when seen in the thickness direction of the semiconductor laser element, only one of the laser beams is set to be totally reflected in the light emission end surface, a refractive angle θ3 of the other laser beam is set to be less than 90 degrees, and the finite difference between the inverse numbers of the arrangement periods (a1, a2) of the first and second periodic structures is different from the finite difference between the inverse numbers of the arrangement periods (a1, a3) of the third and fourth periodic structures.

In the end emission type laser element, in relation with emission due to supply of the driving current to the second driving electrode E2, as an incident angle of the one laser beam to the light emission end surface in the laser element is the total reflection critical angle or more, the laser beam cannot be output to the outside. Since a refractive angle of the other laser beam is less than 90 degrees, the laser beam can be output to the outside via the light emission end surface.

Further, the same effect is exhibited even at the third driving electrode E2 and thereafter from the left side.

Here, in the regions in the photonic crystal layers 4 and 4' corresponding to the driving electrodes, the difference (an emission direction determination factor) between the inverse numbers of the arrangement periods of the differential refractive index sections 4B differs. A value of the difference determines the emission direction of the laser beam. Accordingly, since the value of the difference (the emission direction determination factor) differs in both of the regions, the emission direction of the laser beam differs at the region Δ1 corresponding to the first driving electrode E2 and the region Δ2 corresponding to the second driving electrode E2. In the pair of laser beams generated at the regions, since one laser beam enters the light emission end surface at the total reflection critical angle or more, the laser beam is not emitted to the outside. Accordingly, as the supply of the driving current to the driving electrodes is switched, the laser beam in only one direction can be output in different directions.

Further, in the embodiment, while the case in which the period in the A direction and the B direction is based on a square lattice of (b1, b1) serving as a photonic crystal having different periods, the period is based on a rectangular lattice of (a1, b1) serving as a first periodic structure, and the period is based on a rectangular lattice of (a2, b1) serving as a second periodic structure has been described, of course, a structure in which the period in the A direction differs based on the triangular lattice may be used.

Figure 15:
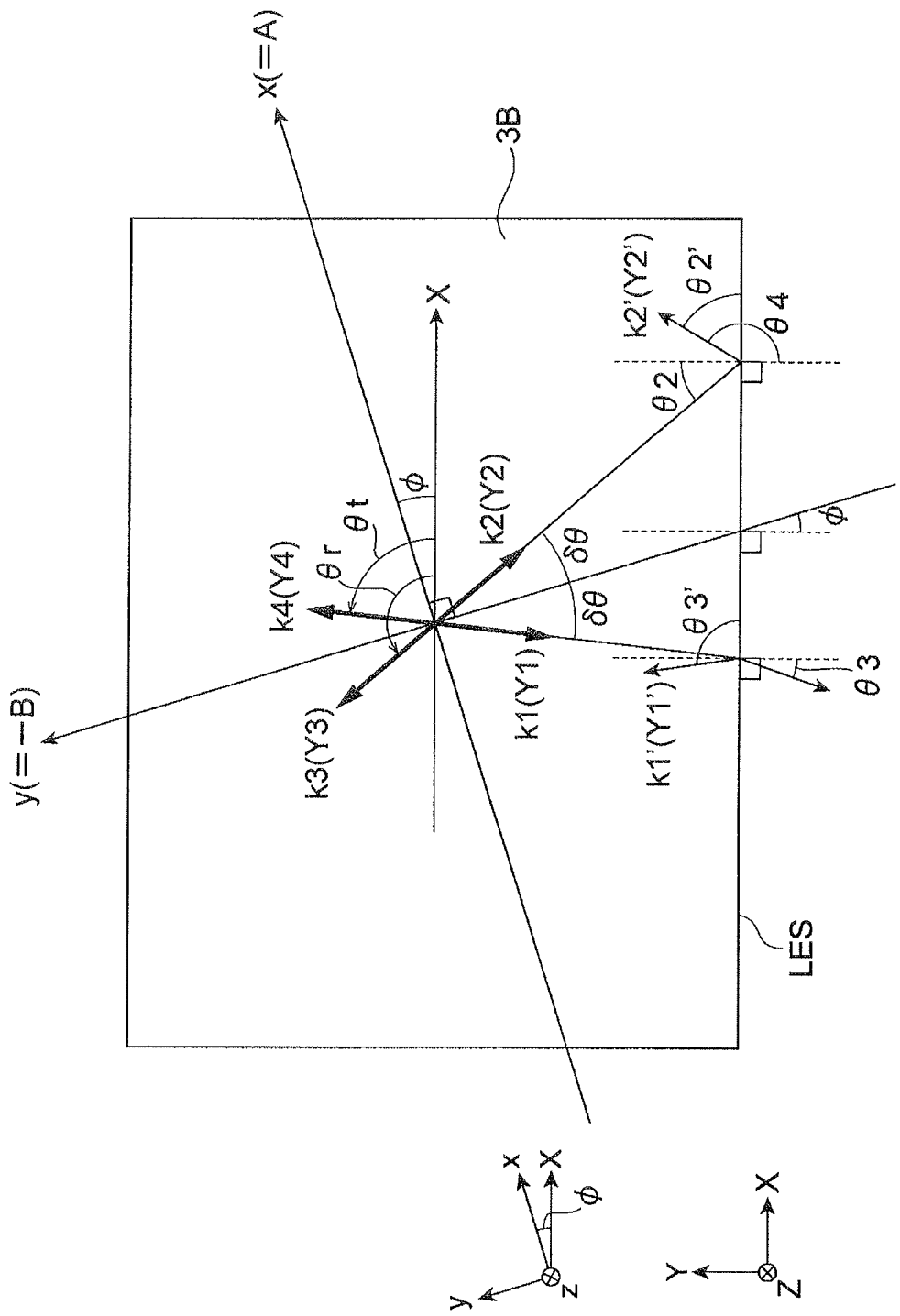
FIG. 15 is a plan view of the inside of the semiconductor laser element.

FIG. 15 is a plan view of the inside of the element in which the refractive angle θ3 of the emitted beam, which is slightly varied, is obtained by reversing the top and the bottom of the plan view of FIG. 3. FIG. 3 is the same as above.

The xyz orthogonal coordinate system is a coordinate system obtained by rotating the XYZ orthogonal coordinate system about the Z-axis by an angle of +φ, a +x direction coincides with a +A direction, and a +y direction coincides with a −B direction. The arrangement of the pattern of the openings of the photonic crystal is inclined with respect to the light emission end surface by the angle φ. As shown, an angle formed by a reflection direction of the wave number vector k2 (a laser beam progress direction of the wave number vector k2') and the light emission end surface LES is represented by θ2', and an angle formed by a reflection direction of the laser beam of the wave number vector k1 (a laser beam progress direction of the wave number vector k1') and the light emission end surface LES is represented as θ3'.

In the above-mentioned embodiment, the number of laser beams emitted from the element is set to be 1, and the laser beam of the wave number vector k2 is set to be the total reflection in the light emission end surface LES. However, when power of the laser beam can be reused in the element, energy conversion efficiency from the electric energy to the laser beam is considered to be increased. Here, a condition in which the reflected laser beam Y2' can be reused therein will be reviewed. Further, the laser beams (referred to as main light waves) corresponding to the wave number vectors k1, k2, k3, k4, k1' and k2' are represented as Y1, Y2, Y3, Y4, Y1' and Y2' to also show vectors of the light waves. In addition, an angle formed by the X-axis and the main light wave Y4 is represented as θt, and an angle formed by the X-axis and the main light wave Y3 is represented as θr.

The parameters θt, θr, θ2' and θ3' satisfy the following relations. Further, $\beta_0$, $\beta_1$ and $\beta_2$ indicate a basic reciprocal lattice vector in the B direction, a basic reciprocal lattice vector in the A direction of the first periodic structure, and a basic reciprocal lattice vector in the A direction of the second periodic structure, and are represented as follows: $\beta_0=2\pi/b1$ (=b2), $\beta_1=2\pi/a1$, $\beta_2=2\pi/a2$, $\Delta\beta=\beta_2-\beta_1$, and $\alpha=\beta_0/\Delta\beta$.

Figure 16:
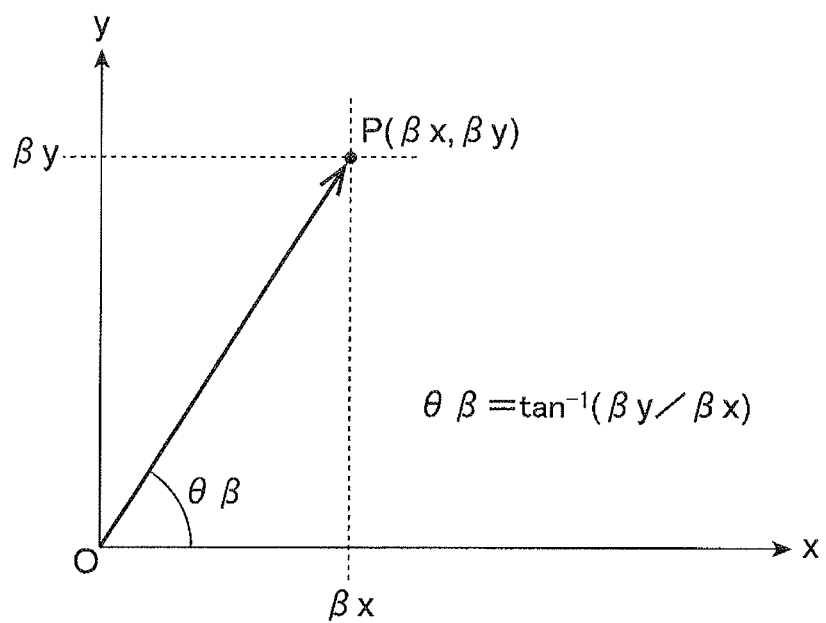
FIG. 16 is a graph showing a vector from an origin O toward a P point ($\beta x$, $\beta y$) in an x-y coordinate system.

When the angle θr is described, as shown in FIG. 16, in the xy coordinate system, a vector from an origin O to a P point (βx, βy) is provided as an angle $\theta\beta=\tan^{-1}(\beta y/\beta x)$ formed with respect to the x-axis. Here, θt is represented as (Equation 1) since the angle φ is added as $\beta x=(1/2)\times\Delta\beta$ and $\beta y=\beta_0$ at θβ. The remaining parameters are also similarly calculated and represented as (Equation 2) to (Equation 4).

$$\theta t=\tan^{-1}(2\alpha)+\phi \quad \text{(Equation 1)}$$

$$\theta r=180°-\tan^{1}(2\alpha)+\phi \quad \text{(Equation 2)}$$

$$\theta 2'=\tan^{-1}(2\alpha)-\phi \quad \text{(Equation 3)}$$

$$\theta 3'=180°-\tan^{-1}(2\alpha)-\phi \quad \text{(Equation 4)}$$

When no additional structure is present, in order to allow the totally reflected main light wave Y2' to contribute to the laser beam resonance, the angle θ2' and the angle θt of the main light wave Y2' should coincide with each other (θ2'=θt). In this case, φ=0. In addition, an angle θ3' and an angle θr of a reflected main light wave Y1' should coincide with each other (θ3'=θr). In this case, φ=0. Meanwhile, in the two main light waves Y1 and Y2, in order to totally reflect the one main light wave, φ≠0 should be satisfied. Accordingly, when the total reflection is performed such that the number of output beams becomes one, the main light wave reflected by the light emission end surface cannot effectively contribute to the laser beam resonance.

Accordingly, an additional structure that can use the reflected light will be reviewed.

Figure 17:
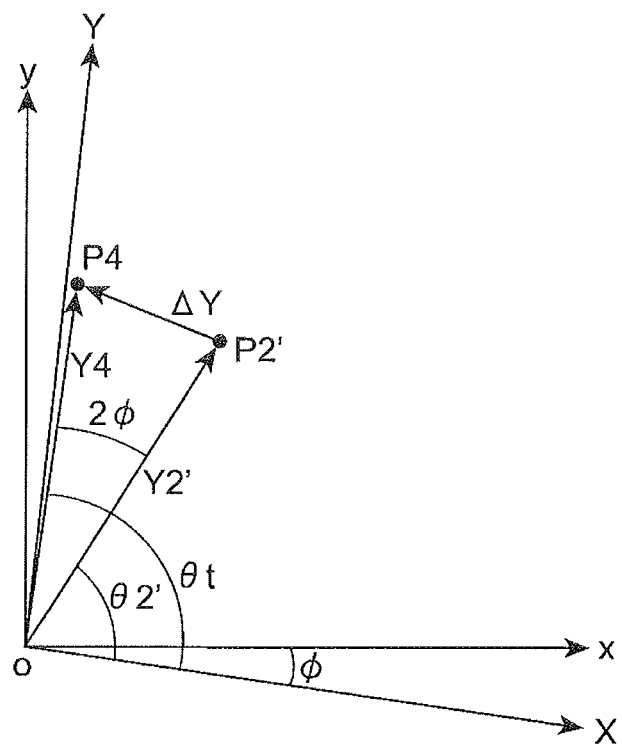
FIG. 17 is a graph showing a direction of a main light wave in the x-y coordinate system.

FIG. 17 is a graph showing a direction of the main light wave in the xy coordinate system. The x-axis of the xy coordinate system is rotated with respect to the X-axis by the angle φ.

In order to allow the main light wave Y2' serving as the reflected light to coincide with the main light wave Y4 provided to the resonance, a direction of the light wave Y2' may be rotated by an angle 2φ. Coordinates of a distal end P4 of a vector representing the main light wave Y4 in the xy coordinate system are $(\Delta\beta/2, \beta_0)$, and coordinates of a distal end P2' of a vector of the main light wave Y2' are coordinates obtained by rotating the distal end P4 by −2φ.

Meanwhile, in the XY coordinate system, the coordinates $(\Delta\beta/2, \beta_0)$ of the vector Y4 (the distal end P4) of the xy coordinate system are converted into coordinates (XA, YA) obtained by rotating the coordinates by +φ, and the coordinates of the vector Y2' are converted into coordinates (XB, YB) obtained by rotating the coordinates of the vector Y4 of the xy coordinate system by −φ.

$$(XA,YA)=(\Delta\beta \cos\phi/2-\beta_0 \sin\phi, \Delta\beta \sin\phi/2+\beta_0 \cos\phi) \quad \text{(Equation 5)}$$

$$(XB,YB)=(\Delta\beta \cos\phi/2+\beta_0 \sin\phi, -\Delta\beta \sin\phi/2+\beta_0 \cos\phi) \quad \text{(Equation 6)}$$

When the equivalent reciprocal lattice vector is present at a vector ΔY, the main light wave Y2' is coupled to the main light wave Y4. That is, the vector ΔY is added to the vector Y2', it becomes the vector Y4. The vector ΔY is represented as follows, and when a new periodic structure having the equal reciprocal lattice vector is additionally employed for the vector ΔY, the totally reflected light wave Y2' can contribute to the resonance.

$$\Delta Y=(XA-XB, YA-YB)=(-2\beta_0 \sin\phi, \Delta\beta\sin\phi)$$

Further, the new periodic structure may be a structure in which the differential refractive index sections are disposed in a stripe shape.

The stripe-shaped periodic structure has high anisotropy of an optical coupling coefficient, and can reduce an influence exerted on Y1 and Y2 of resonance states.

Figure 18:
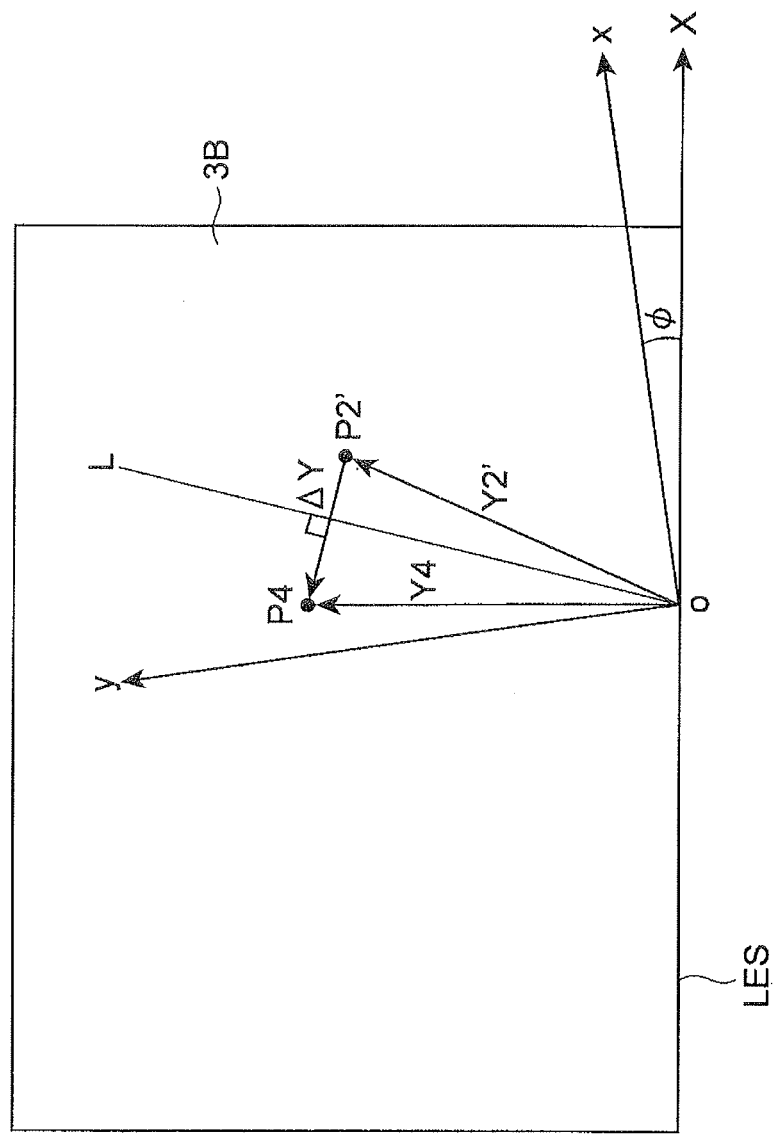
FIG. 18 is a plan view of the inside of the element for describing a main light wave in an active layer 3B.

FIG. 18 is a plan view of the inside of the element for describing the main light wave in the active layer 3B.

A line of intersection between the XY plane and the light emission end surface LES coincides with an X-axis. When the above-mentioned vector ΔY is present, the wave number vector of the light wave Y2' having a distal end disposed at coordinates P2' is converted into the wave number vector of the light wave Y4 having a distal end disposed at coordinates P4. A straight line perpendicular to the vector ΔY is represented as L. The new periodic structure may be set such that the light wave progresses in a direction perpendicular to the straight line L in the active layer 3B. In order to control the progress direction of the light wave in the active layer 3B, the pattern of the diffraction lattice layer optically coupled thereto is controlled. In the above-mentioned FIG. 14, upper and lower photonic crystal layers (diffraction lattice layers) 4 and 4' are provided. In the case of such a structure, the photonic crystal layer that accomplishes the above-mentioned total reflection can be manufactured in the upper diffraction lattice layer 4, and the new periodic structure configured to use the reflected light in the resonance can be manufactured in a diffraction lattice layer 4' (of course, these periodic structures may be manufactured by overlapping the structure and any one or both of the layers).

FIG. 19(A) is a plan view of the diffraction lattice layer 4' having the periodic structure that provides the vector ΔY, and FIG. 19(B) is a cross-sectional view in the XZ plane.

The diffraction lattice layer 4' includes the basic layer 4A' and the differential refractive index section 4B' extending along the straight line L in a stripe shape in the XY plane, and these refractive indices are different. The differential refractive index sections 4B' are periodically buried in the basic layer 4A'. Accordingly, a stripe-shaped periodical refractive index distribution structure is formed in the diffraction lattice layer 4', and functions as a diffraction lattice layer configured to advance a light wave in a ΔY direction. As a ratio of a width of the basic layer 4A' in a direction perpendicular to the straight line L occupying a period Λ of the periodic structure is varied, strength of the diffraction by the stripe-shaped periodic refractive index distribution structure can be varied. A length L2 of the reciprocal lattice vector of ΔY in the reciprocal lattice space, the period Λ, and the angle θ formed by the straight line L and the X-axis are represented as follows.

$$L2=\{(2\beta_0 \sin\phi)^2+(\Delta\beta \sin\phi)^2\}^{1/2} \quad \text{(Equation 7)}$$

$$\Lambda=2\pi/L2=1/\{(2 \sin\phi/a_y)^2+((1/a_{II}-1/a_I)\sin\phi)^2\}^{1/2} \quad \text{(Equation 8)}$$

$$\theta=\theta t-\phi=\tan^{-1}(2\alpha)=\tan^{-1}\{(2/a_y)/(1/a_{II}-1/a_I)\} \quad \text{(Equation 9)}$$

Further, $\beta_0=2\pi/a_y$, $\beta_1=2\pi/a_I$ and $\beta_2=2\pi/a_{II}$ are satisfied, $a_y$ represents a period in the B direction, $a_I$ represents a period in the A direction of the first periodic structure, and $a_{II}$ represents a period in the A direction of the second periodic structure.

Figure 20:
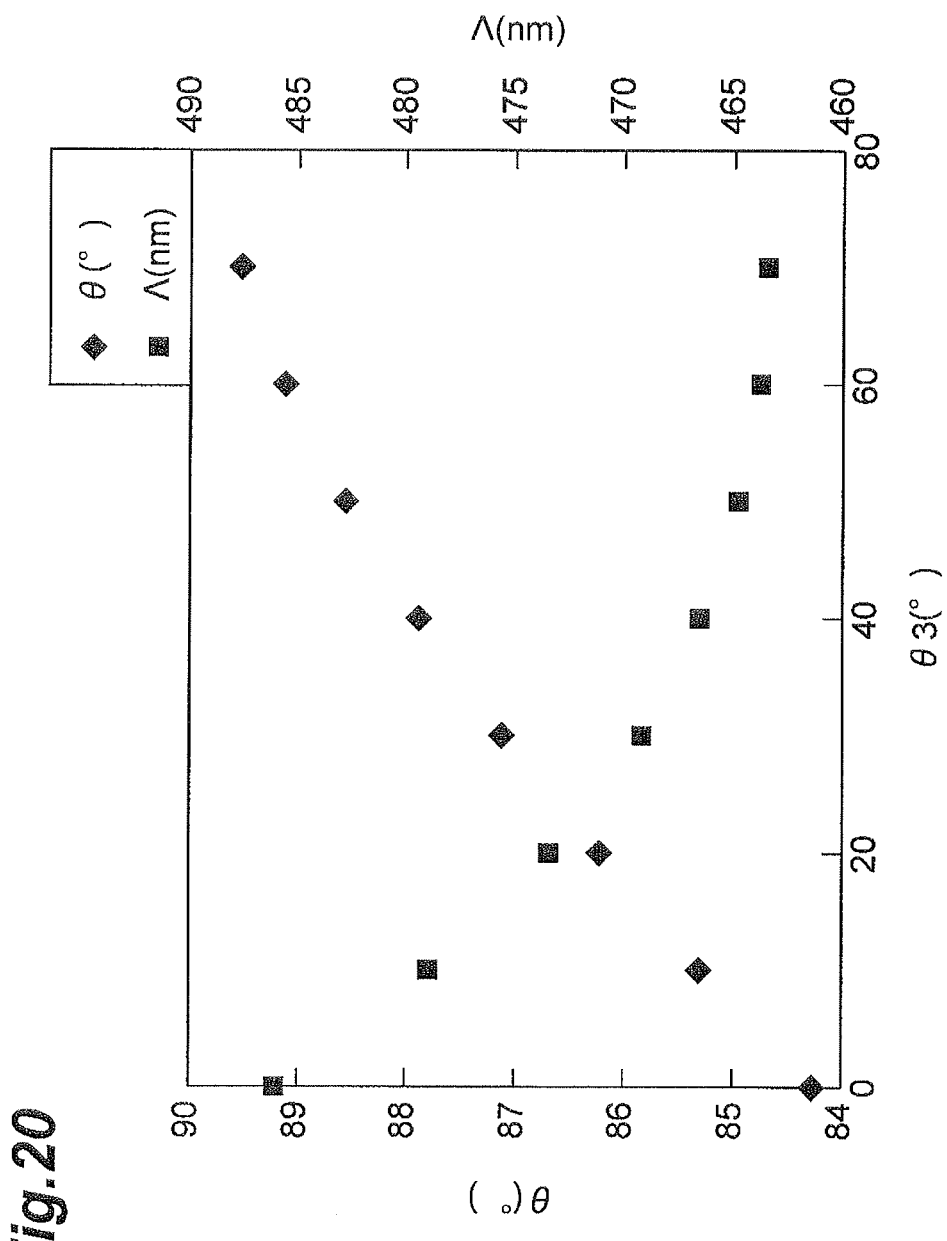
FIG. 20 is a graph showing a relation between a laser beam emission angle (a refractive angle) $\theta3$, and an angle $\theta$ and a period $\Lambda$ of straps.

FIG. 20 is a graph showing a relation between the laser beam emission angle (the refractive angle) θ3, the angle θ of the stripe, and the period Λ, and FIG. 21 is a table showing data used in the graph. A vertical axis of the data of θ (°) is represented on the left side of the graph, and a vertical axis of the data of Λ (nm) is represented on the right side of the graph.

It will be appreciated that the angle θ of the stripe is increased and the period Λ is reduced as the laser beam emission angle θ3 is increased. In the same graph, when the angle θ3 is increased from 0° to 70°, while the angle θ is increased from 84.27° to 89.54° and the period Λ is reduced from 486.08 nm to 463.43 nm, they fall in a realistically feasible numerical range.

Figure 19:
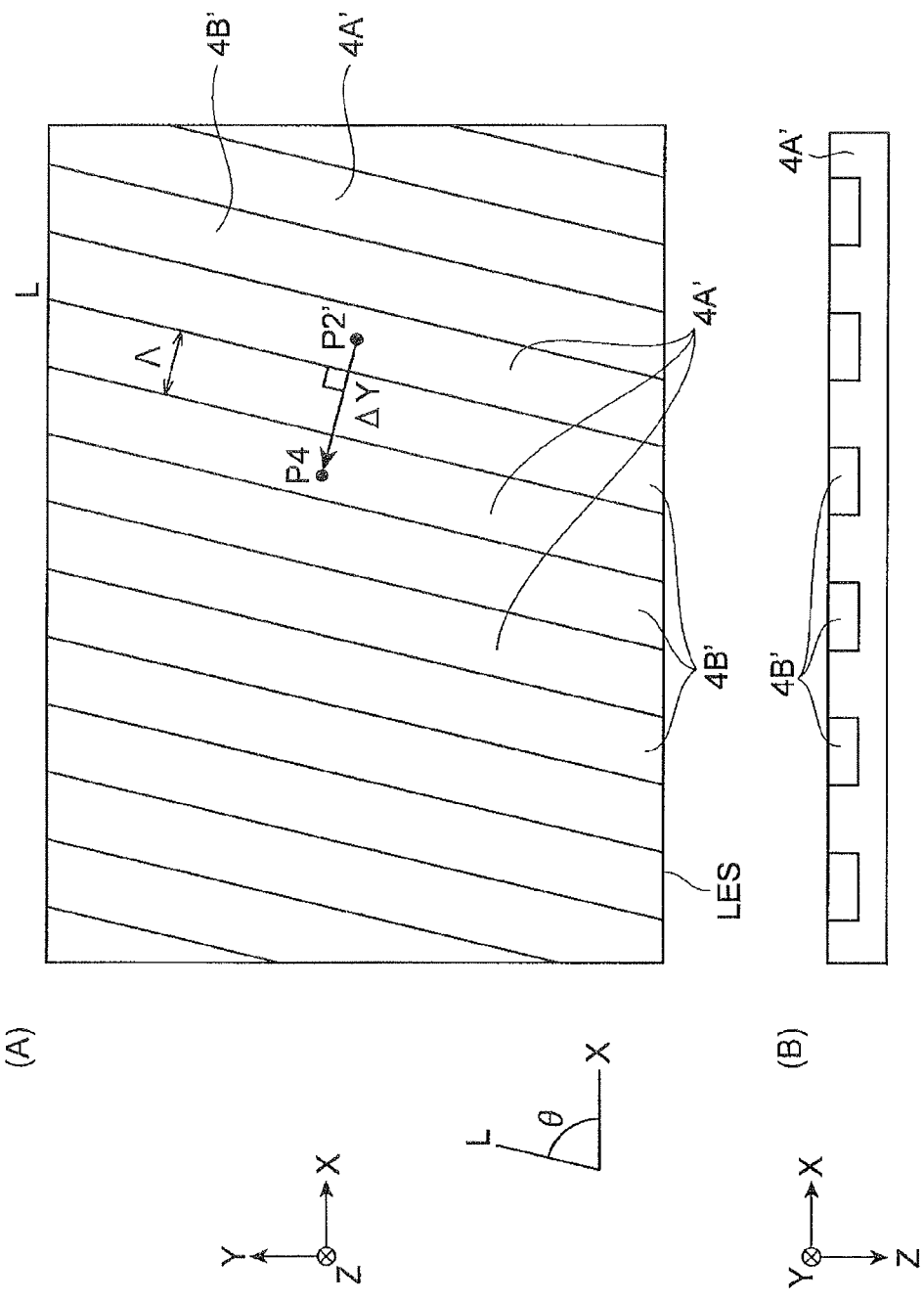
FIG. 19A is a plan view of a diffraction lattice layer 4' having a periodic structure.
FIG. 19B is a cross-sectional view in an XZ plane.
Figure 22:
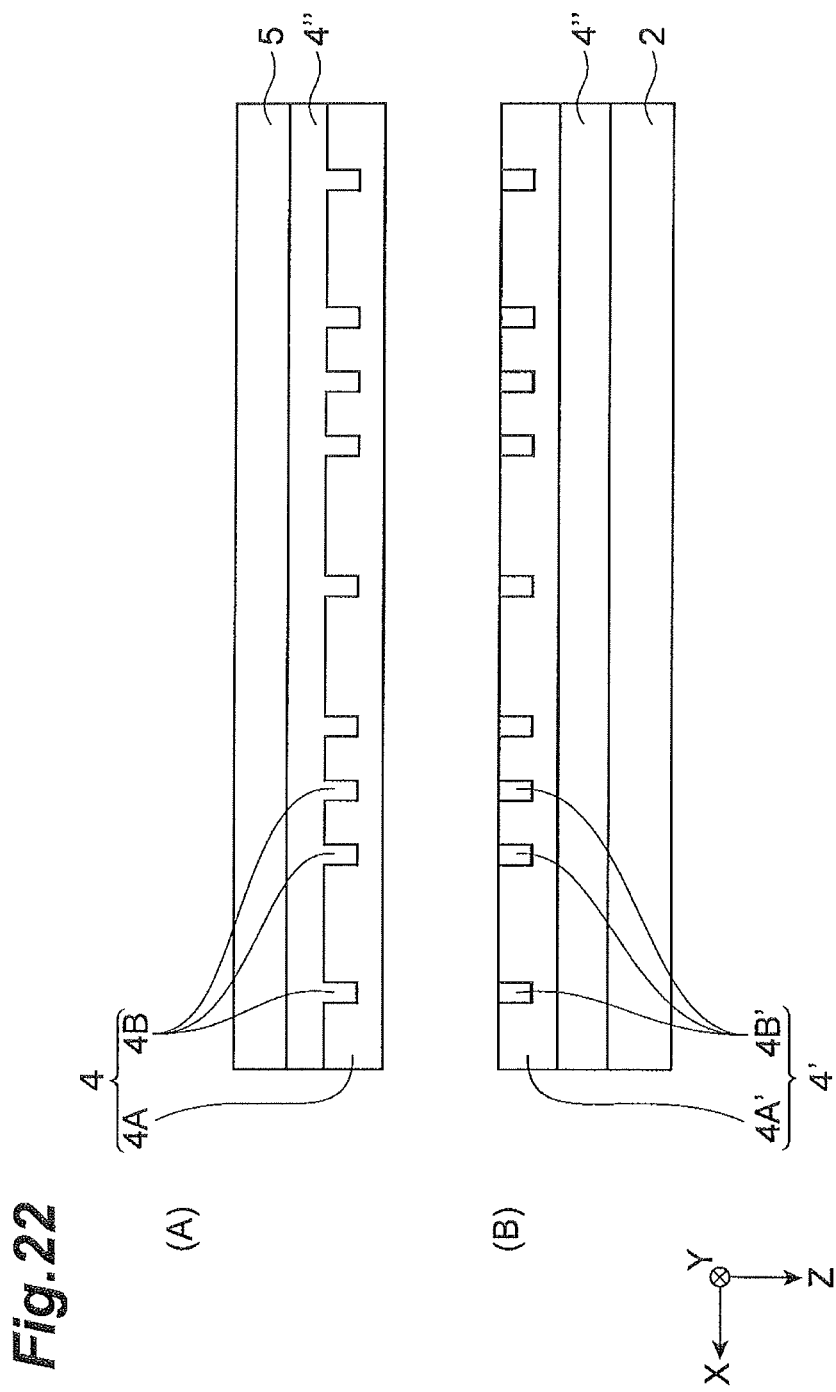
FIG. 22 is a cross-sectional view of a partial region of the semiconductor laser element.

Further, in FIG. 14, when the period pattern for total reflection is manufactured in both of the photonic crystal layers 4 and 4', separately therefrom, a diffraction lattice layer 4" of the new periodic structure (the structure is the same as that of the diffraction lattice layer 4' in FIG. 19) configured to provide ΔY can be manufactured between the upper cladding layer 5 and the diffraction lattice layer 4 (FIG. 22(A)). Alternatively, the diffraction lattice layer 4" of the new periodic structure (the structure is the same as that of the diffraction lattice layer 4' in FIG. 19) configured to provide ΔY may be formed between the lower cladding layer 2 and the diffraction lattice layer 4' (FIG. 22(B)). In this way, in this example, a diffraction lattice structure (a diffraction lattice layer of FIGS. 19 and 22) configured to couple the laser beam reflected by the light emission end surface to the laser beam resonated in the active layer to contribute to the resonance by satisfying the total reflection critical angle condition is further provided. In this case, energy utilization efficiency is increased.

FIG. 23 is a plan view of the photonic crystal layer 4 having various periodic structures. Even in the entire photonic crystal layer 4, the differential refractive index sections 4B are periodically buried in the basic layer 4A. A square lattice is shown in FIG. 23(A), a rectangular lattice is shown in FIG. 23(B), a triangular lattice is shown in FIG. 23(C), and a face-centered rectangular lattice is shown in FIG. 23(D). As described above, the photonic crystal layer 4 employs a configuration in which two periodic structures having different periods overlap in the one photonic crystal layer 4 or two periodic structures are included in each of the two photonic crystal layers 4 and 4', and overlap when seen in a plan view. In these drawings, examples of the periodic structures before the overlapping are shown, and two kinds of periodic structures are disposed to overlap such that basic translation vectors (shown by arrows) thereof coincide with each other.

Specifically, in the photonic crystal layer 4 of FIG. 23(A), the differential refractive index sections 4B are disposed at lattice point positions of the square lattice. The square lattice has a shape such that the square shapes can be arranged with no gap, and a length a of one side of the square shape configuring one lattice is equal to a length b of the other side. In other words, an arrangement period a in a horizontal direction of the differential refractive index section 4B is equal to an arrangement period b in a vertical direction. Here, a solid arrow of the drawing represents a basic translation vector of the lattice. Even when the pattern is moved in parallel by a linear sum of an integer times the basic translation vectors, the pattern overlaps an original pattern. That is, the lattice system has translational symmetry defined by the basic translation vectors.

In the photonic crystal layer 4 of FIG. 23(B), the differential refractive index sections 4B are disposed at lattice point positions of the rectangular lattice. The rectangular lattice having different vertical and horizontal lengths has a shape such that rectangular shapes can be arranged with no gap, and a length a of one side of the rectangular shape configuring one lattice is different from a length b of the other side. In other words, an arrangement period a in the horizontal direction of the differential refractive index section 4B is different from an arrangement period b in the vertical direction. Here, a solid arrow of the drawing represents a basic translation vector of the lattice. Even when the pattern is moved in parallel by a linear sum of an integer times the basic translation vectors, the pattern overlaps an original pattern. That is, the lattice system has translational symmetry defined by the basic translation vectors.

In the photonic crystal layer 4 of FIG. 23(C), the differential refractive index sections 4B are disposed at lattice point positions of the triangular lattice. The triangular lattice has a shape such that the triangles can be arranged with no gap, a length of a bottom side of the triangle configuring one lattice is represented as a, and a height is represented as b. When the triangle is a regular triangle, the length a of the bottom side is the arrangement period a in the horizontal direction of the differential refractive index section 4B, and the arrangement period b in the vertical direction is √2 times a. Here, a solid arrow of the drawing represents a basic translation vector of the lattice. Even when the pattern is moved in parallel by a linear sum of an integer times the basic translation vectors, the pattern overlaps an original pattern. That is, the lattice system has translational symmetry defined by the basic translation vectors.

In the photonic crystal layer 4 of FIG. 23(D), the differential refractive index sections 4B are disposed at lattice point positions of the face-centered rectangular lattice. The face-centered rectangular lattice is a lattice additionally including lattice points at a central position in each lattice of the rectangular lattice, and in the rectangular lattice itself, the rectangular shapes can be arranged with no gap. Here, a solid arrow of the drawing represents a basic translation vector of the lattice. Even when the pattern is moved in parallel by a linear sum of an integer times the basic translation vectors, the pattern overlaps an original pattern. That is, the lattice system has translational symmetry defined by the basic translation vectors.

Further, as described above, an A-axis is inclined with respect to the X-axis, and these are not parallel to each other. In other words, even in the entire photonic crystal layer 4 described in FIGS. 1 to 23, when seen in the thickness direction of the semiconductor laser element, the differential refractive index sections 4B in the photonic crystal layer 4 are disposed at the lattice point positions of the lattice structure, and a direction of the basic translation vector (the A-axis and the B-axis) of the lattice structure is different from the direction (the X-axis) parallel to the light emission end surface LES (see FIG. 3). In this case, as the inclination is a certain level or more, one laser beam can satisfy the total reflection critical angle condition.

In addition, the lattice structure of the photonic crystal layer may be configured by combining the square lattice, the rectangular lattice, the triangular lattice and the face-centered rectangular lattice, for example, the square lattice and the rectangular lattice, the rectangular lattice and the rectangular lattice, the triangular lattice and the face-centered rectangular lattice, the face-centered rectangular lattice and the face-centered rectangular lattice, and so on, when seen in the thickness direction. That is, the lattice structure may be configured by combining lattices having different pitches with respect to the one lattice as described above in any one direction.

When the above-mentioned square lattice (FIG. 23(A)) and the rectangular lattice (FIG. 23(B)) overlap, the crystal structures of the square lattice and the rectangular lattice are included in the photonic crystal layer 4 (or 4 and 4'), and thus, when the period in the axial direction of one side of the rectangular lattice is represented as a1, the period in the axial direction perpendicular to the one axis is represented as b1, the period in the axial direction of one side of the rectangular lattice is represented as a2, and the period in the axial direction perpendicular to the one axis is represented as b2, a1=b1, a1≠a2 and b1=b2 can be satisfied. In this case, a standing wave state by diagonal light waves, which are not perpendicular to each other, is formed in the photonic crystal layer surface, and an effect of varying an angle formed by the diagonal light waves according to a finite difference between a1 and a2 is exhibited.

In addition, when the two rectangular lattices (FIG. 23(B)) overlap, the crystal structures of the first and second rectangular lattices are included in the photonic crystal layer 4 (or 4 and 4'), and thus, when the period in the axial direction of one side of the first rectangular lattice is represented as a1, the period in the axial direction perpendicular to the one axis is represented as b1, the period in the axial direction of one side of the second rectangular lattice is represented as a2, and the period in the axial direction perpendicular to the one axis is represented as b2, a1≠a2 and b1=b2 can be satisfied. In this case, a standing wave state by diagonal light waves, which are not perpendicular to each other, is formed in the photonic crystal layer surface, and an effect of varying an angle formed by the diagonal light waves according to a finite difference between a1 and a2 is exhibited.

In addition, when the two face-centered rectangular lattices (FIG. 23(D)) overlap, the crystal structures of the first and second face-centered rectangular lattices are included in the photonic crystal layer 4 (or 4 and 4'), and thus, when the period in the axial direction of one side of the first face-centered rectangular lattice is represented as a1, the period in the axial direction perpendicular to the one axis is represented as b1, the period in the axial direction of one side of the second face-centered rectangular lattice is represented as a2, and the period in the axial direction perpendicular to the one axis is represented as b2, a1≠a2 and b1=b2 can be satisfied. In this case, a standing wave state by diagonal light waves, which are not perpendicular to each other, is formed in the photonic crystal layer surface, and an effect of varying an angle formed by the diagonal light waves according to a finite difference between a1 and a2 is exhibited.

The one face-centered rectangular lattice may be the triangular lattice. The triangular lattice is a special case in which an angle formed by the basic translation vectors forming the lattice of the face-centered rectangular lattice is 60 degrees.

In addition, as shown in FIG. 1, the semiconductor laser element 10 includes regions (a first region, a second region . . . ) R immediately under the driving electrode of the active layer 3B. The differential refractive index section 4B of the photonic crystal layer corresponding to the first region R of the active layer 3B and the differential refractive index section 4B of the photonic crystal layer corresponding to the second region R of the active layer 3B may be set such that refractive angles of the laser beams output from the first region R and the second region R differ from each other, strengths coincide with each other, and various shapes when seen in the thickness direction of the semiconductor laser element differ from each other. In other words, a size of an opening (a differential refractive index section) is varied such that diffraction strengths of a plurality of photonic crystals become equal. Since the strengths are equal, the opening can be easily applied to electronic instruments and so on such as a laser printer, radar, or the like.

For example, the opening (the differential refractive index section) varies a length in a direction along the basic translation vector of a side at which the periods differ. Specifically, in the first region R, dimensions of the differential refractive index sections 4B in the direction (for example, the B-axis) in which the arrangement periods of the differential refractive index sections 4B in the first periodic structure and the second periodic structure differ from each other differ according to positions in the different directions, and in the second region R, dimensions of the differential refractive index sections 4B in the direction (for example, the B-axis) in which the arrangement periods of the differential refractive index sections 4B in the third and fourth periodic structures differ from each other differ according to positions in the different directions. Accordingly, the diffraction strengths in the first periodic structure and the second periodic structure or the diffraction strengths in the third periodic structure and the fourth periodic structure can be arranged, and oscillation can be stabilized.

In addition, the laser beam deflecting device shown in FIG. 11 includes the semiconductor laser element 10, and the driving current supply circuit 11 configured to selectively supply a driving current to the electrode group E2 including the first driving electrode and the second driving electrode. As supply of the driving current is controlled, emission of the laser beam LB can be controlled. Here, the driving current supply circuit 11 may further have a means for varying a ratio of the driving currents supplied to the electrodes E2 of the electrode group. That is, in FIG. 11, reference characters SW1 to SW5 represent switch-attached amplifiers, and a configuration in which a magnitude of the driving current supplied from the power circuit 11A is controlled by the corresponding amplifier may be provided. In this case, the controlling circuit 11B can control the ratio of the driving current supplied to each of the electrodes E2 by controlling gain of each amplifier.

In addition, the period along the basic translation vector in the first periodic structure in the first region R can be continuously varied as it approaches the third periodic structure in the second region R. In this case, generation of reflection in an interface between the photonic crystals having different periods can be prevented.

In addition, in the laser beam deflecting device shown in FIG. 11, the wavelengths of the laser beams output from the active layer immediately under the electrodes E2 may be equal to each other. This is because, when the laser beam scanning is performed by a mirror or the like, the wavelengths of the laser beams before and after deflection are equal to each other. Here, when the driving current is supplied to the first and second driving electrodes E2, resonance wavelengths of the laser beams generated from the first region R and the second region R of the active layer immediately under the first and second driving electrodes E2 may be set to be equal to each other.

That is, the periodic structures (the first periodic structure and the second periodic structure) overlapping in the first region R and the periodic structures (the third periodic structure and the fourth periodic structure) overlapping in the second region R satisfy the following relation. For example, considering the structure constituted by combining the rectangular lattice and the rectangular lattice, the following relations are satisfied.

$$b11=b21=b_0/\sqrt{(1-\sin^2\delta\theta 1)}$$

$$\delta\theta 1=\phi-\sin^{-1}(\sin\theta 31/n_{dev})$$

$$b12=b22=b_0/\sqrt{(1-\sin^2\delta\theta 2)}$$

$$\delta\theta 2=\phi-\sin^{-1}(\sin\theta 32/n_{dev})$$

Here, the period in the B-axis direction of the first rectangular lattices overlapping in the first region R is represented as b11, the period in the B-axis direction of the second rectangular lattices is represented as b21, the beam emission angle of the first region R is represented as θ31, the period in the B-axis direction of the first rectangular lattices overlapping in the second region R is represented as b12, the period in the B-axis direction of the second rectangular lattices is represented as b22, and the beam emission angle of the second region R is represented as θ32.

Further, while combination of the rectangular lattice and the rectangular lattice has been described, the above-mentioned description is also the same as in another lattice system.

In addition, as shown in FIG. 11, the laser beam deflecting device may include a single light collecting element (a lens) LS disposed in the vicinity of the light emission end surface LES. A flare angle of the emission light can be suppressed by the light collecting element, the laser beam can be transmitted far away, and the laser beam can be collected at a position spaced an appropriate distance from the element by adjusting a focal position. The light collecting element LS is a cylindrical lens, and a central axis X of the cylindrical lens is perpendicular to the thickness direction (the Z-axis) of the active layer and parallel to the light emission end surface (the XZ plane). A radius of curvature of the cylindrical lens is defined only in the YZ plane.

Further, a convex lens may be employed as the light collecting element LS. One axis (the X-axis) passing through a center of curvature of the convex lens is perpendicular to the thickness direction (the Z-axis) of the active layer and parallel to the light emission end surface (the XZ plane), and a radius of curvature around the axis (the X-axis) is smaller than the radius of curvature (may be approximate to infinity) around the axis (the Y-axis or the Z-axis) perpendicular thereto. In other words, a convex lens having a linear section of the cylindrical lens, which is slightly increased, may be employed.

Further, the above-mentioned laser beam deflecting device can be miniaturized and high reliability and acceleration can also be expected because the element itself has a deflection function. Since the device has a small size, the device may be combined with a mobile device or may be used as a light source for laser mes or photo dynamic therapy (PDT) combined with a medical capsule endoscope. Of course, application to a display by large laser scanning is also considered. Since stray light of the laser beam is not output to the outside, improvement of reliability can be expected.

Reference Signs List

| 10 | semiconductor laser element | | |
|---|---|---|---|
| 1 | semiconductor substrate | 2 | lower cladding layer |
| 3A | lower light guide layer | 3B | active layer |
| 3C | upper light guide layer | 4 | photonic crystal layer |
| 5 | upper cladding layer | 6 | contact layer |
| E2 | driving electrode | | |

The invention claimed is:

1. An end emission type semiconductor laser element comprising:
a lower cladding layer formed on a substrate;
an upper cladding layer;
an active layer interposed between the lower cladding layer and the upper cladding layer;
a photonic crystal layer interposed between the active layer and at least one of the upper and lower cladding layers; and
a first driving electrode configured to supply a driving current to a first region of the active layer,
wherein a lengthwise direction of the first driving electrode is inclined with respect to a normal line of a light emission end surface of the semiconductor laser element when seen in a thickness direction of the semiconductor laser element,
a region of the photonic crystal layer corresponding to the first region has first and second periodic structures in which arrangement periods of differential refractive index sections having different refractive indices from surroundings differ from each other, and
according to a finite difference between inverse numbers of the arrangement periods of the first and second periodic structures, when seen in a thickness direction of the semiconductor laser element, at least two laser beams that form a predetermined angle with respect to the lengthwise direction of the first driving electrode are generated in the semiconductor laser element, one of the laser beams directed toward the light emission end surface is set to be less than a refractive angle of 90 degrees with respect to the light emission end surface, and at least one separate laser beam toward the light emission end surface is set to satisfy a total reflection critical angle condition with respect to the light emission end surface.

2. The semiconductor laser element according to claim 1, further comprising a second driving electrode configured to supply a driving current to a second region of the active layer,
wherein a lengthwise direction of the second driving electrode is inclined with respect to a normal line of the light emission end surface of the semiconductor laser element when seen in the thickness direction of the semiconductor laser element,
a region of the photonic crystal layer corresponding to the second region has third and fourth periodic structures in which arrangement periods of differential refractive index sections having different refractive indices from surroundings differ from each other,
according to a finite difference between inverse numbers of the arrangement periods in the third and fourth periodic structures, when seen in the thickness direction of the semiconductor laser element, at least two laser beams that form a predetermined angle with respect to the lengthwise direction of the second driving electrode are generated in the semiconductor laser element, one of the laser beams directed toward the light emission end surface is set to be less than a refractive angle of 90 degrees with respect to the light emission end surface, at least one separate laser beam directed toward the light emission end surface is set to satisfy a total reflection critical angle condition with respect to the light emission end surface, and
the finite difference between the inverse numbers of the arrangement periods in the first and second periodic structures is different from the finite difference between the inverse numbers of the arrangement periods in the third and fourth periodic structures.

3. The semiconductor laser element according to claim 1, wherein, when seen in the thickness direction of the semiconductor laser element,
the differential refractive index sections in the photonic crystal layer are disposed in the lattice point positions of the lattice structure, and a direction of a basic translation vector of the lattice structure is different from a direction parallel to the light emission end surface.

4. The semiconductor laser element according to claim 1, wherein the lattice structure of the photonic crystal layer is configured by selecting and combining at least two lattices from a lattice group constituted by a square lattice, a rectangular lattice, a triangular lattice, and a face-centered rectangular lattice, comprising the case of overlapping selection.

5. The semiconductor laser element according to claim 1, wherein, provided that crystal structures of a square lattice and a rectangular lattice are included in the photonic crystal layer,
the period in an axial direction of one side of the rectangular lattice is represented as a1 and the period in the axial direction perpendicular to the one axis is represented as b1, and
the period in the axial direction of one side of the rectangular lattice is represented as a2 and the period in the axial direction perpendicular to the one axis is represented as b2, a1=b1,
a1≠a2, and
b1=b2
are satisfied.

6. The semiconductor laser element according to claim 1, wherein, provided that crystal structures of first and second rectangular lattices are included in the photonic crystal layer,
the period in the axial direction of one side of the first rectangular lattice is represented as a1 and the period in the axial direction perpendicular to the one axis is represented as b1, and
the period in the axial direction of one side of the second rectangular lattice is represented as a2 and the period in the axial direction perpendicular to the one axis is represented as b2, a1≠a2, and
b1=b2
are satisfied.

7. The semiconductor laser element according to claim 1, wherein, provided that crystal structures of first and second face-centered rectangular lattices are included in the photonic crystal layer,
the period in the axial direction of one side of the first face-centered rectangular lattice is represented as a1 and the period in the axial direction perpendicular to the one axis is represented as b1, and
the period in the axial direction of one side of the second face-centered rectangular lattice is represented as a2 and the period in the axial direction perpendicular to the one axis is represented as b2, a1 ≠a2, and
b1=b2
are satisfied.

8. The semiconductor laser element according to claim 7, wherein the first face-centered rectangular lattice is a triangular lattice.

9. The semiconductor laser element according to claim 2, wherein the differential refractive index section of the photonic crystal layer corresponding to the first region of the active layer and the differential refractive index section of the photonic crystal layer corresponding to the second region of the active layer have different shapes when seen in the thickness direction of the semiconductor laser element such that refractive angles of the laser beams output from the first and second regions differ from each other and strengths coincide with each other.

10. The semiconductor laser element according to claim 9, wherein dimensions of the differential refractive index sections in directions in which arrangement periods of the differential refractive index sections in the first and second periodic structures differ from each other differ according to positions in the different directions, and
dimensions of the differential refractive index sections in directions in which arrangement periods of the differential refractive index sections in the third and fourth periodic structures differ from each other differ according to positions in the different directions.

11. The semiconductor laser element according to claim 1, further comprising a diffraction lattice structure configured to combine a laser beam reflected by the light emission end surface with a laser beam resonated in the active layer by satisfying a total reflection critical angle condition.

12. A laser beam deflecting device comprising:
the semiconductor laser element according to claim 2; and
a driving current supply circuit configured to selectively supply a driving current to an electrode group comprising the first driving electrode and the second driving electrode.

13. The laser beam deflecting device according to claim 12, wherein the driving current supply circuit further has a means configured to vary a ratio of the driving currents supplied to the electrodes of the electrode group.

14. The laser beam deflecting device according to claim 12, wherein a period along a basic translation vector in the first periodic structure is continuously varied as the period approaches the third periodic structure.

15. The laser beam deflecting device according to claim 12, wherein, when $\phi$ represents an inclination of an arrangement direction of the differential refractive index sections with respect to a direction perpendicular to the light emission end surface, $\theta 3$ represents an emission angle of the laser beam, and $n_{dev}$ represents an effective refractive index of light in the semiconductor laser element, the period is in reverse portion $\sqrt{\{1-\sin^2(\phi-\sin^{-1}(\sin \theta 3/n_{dev}))\}}$ in relation with one of directions along the basic translation vectors in the first, second, third and fourth periodic structures such that resonance wavelengths of the laser beams generated from the first and second regions of the active layer immediately under the first and second driving electrodes become equal when a driving current is supplied to the first and second driving electrodes.

16. The laser beam deflecting device according to claim 12, comprising a single light collecting element disposed in the vicinity of the light emission end surface.

17. The laser beam deflecting device according to claim 16, wherein the light collecting element is a cylindrical lens, and a central axis of the cylindrical lens is perpendicular to a thickness direction of the active layer and parallel to the light emission end surface.

18. The laser beam deflecting device according to claim 16, wherein the light collecting element is a convex lens, one axis passing through a center of curvature of the convex lens is perpendicular to a thickness direction of the active layer and parallel to the light emission end surface, and a radius of curvature around the axis is smaller than a radius of curvature around an axis perpendicular thereto.

* * * * *